(12) United States Patent
Shih et al.

(10) Patent No.: US 7,967,960 B2
(45) Date of Patent: Jun. 28, 2011

(54) FLUID-CONFINING APPARATUS

(75) Inventors: Hui-Shen Shih, Chang-Hua Hsien (TW); Yu-Fang Chien, Taipei County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 829 days.

(21) Appl. No.: 11/935,416

(22) Filed: Nov. 6, 2007

(65) Prior Publication Data

US 2009/0117740 A1    May 7, 2009

(51) Int. Cl.
 *C25D 17/00*    (2006.01)
(52) U.S. Cl. .................................. 204/225; 204/275.1
(58) Field of Classification Search ............... 204/225, 204/275.1
See application file for complete search history.

(56) References Cited

U.S. PATENT DOCUMENTS

| 6,277,260 | B1 | 8/2001 | Kaufman |
| 6,521,102 | B1 | 2/2003 | Dordi |
| 6,558,518 | B1 | 5/2003 | Sendai |
| 6,773,559 | B2 * | 8/2004 | Woodruff et al. ............. 204/222 |
| 6,890,416 | B1 | 5/2005 | Mayer |
| 2003/0057098 | A1 | 3/2003 | Sendai |
| 2005/0023149 | A1 * | 2/2005 | Nakada et al. ............... 205/137 |
| 2006/0023184 | A1 | 2/2006 | Coon |

* cited by examiner

*Primary Examiner* — Luan V Van
(74) *Attorney, Agent, or Firm* — Winston Hsu; Scott Margo

(57) ABSTRACT

The fluid-confining apparatus includes at least a substrate holder, at least a confining fluid supplying tube, at least a confining fluid recovering tube, at least a process fluid supplying tube, and at least a process fluid recovering tube. The process fluid supplying tube supplies at least a process fluid, and makes the process fluid contact with at least a treatment region of a wafer. The confining fluid supplying tube continuity supplies at least a confining fluid. The confining fluid does not dissolve the process fluid. The flowing confining fluid can contact with at least a non-treatment region of the wafer, and confines the process fluid into a predetermined space.

3 Claims, 33 Drawing Sheets

FLUID-CONFINING APPARATUS

BACKGROUND OF THE INVENTION

1. Field of the Invention

The present invention provides a fluid-confining apparatus and method of operating it, and especially a fluid-confining apparatus that can be applied to a plating process, a cleaning process or a polishing process.

2. Description of the Prior Art

Technologies used for depositing a metal material layer include a physical vapor deposition, a chemical vapor deposition, an electroless plating process, an electro-chemical deposition, and so forth at present. With advantages of low cost and high throughput, electro chemical plating (ECP) technology is widely used in the semiconductor industry. During the process of electro chemical plating, the uniformity of the surface of the formed layer is affected by factors such as a component of an electrolyte fluid, temperature, current density, and a cleanness of the deposited surface.

Please refer to FIG. 1 through FIG. 3. FIG. 1, FIG. 2 and FIG. 3 are schematic diagrams illustrating a prior art electro chemical plating process. As shown in FIG. 1, a wafer 10 and a plating apparatus 20 are first provided. The plating apparatus 20 includes an electrolytic tank 12, an electrolyte fluid 22, an anode system 14, a cathode electrode 16 and a fixing component 18. The electrolytic tank 12 is applied for storing the electrolyte fluid 22, and the main component of the electrolyte fluid 22 is metal ions. The anode system 14 includes an anode chamber 30, an anode electrode 24, a filter membrane 26, a diffuser membrane 28, and an electrolyte fluid supplying tube 32.

The wafer 10 is positioned between the cathode electrode 16 and the fixing component 18 so that the wafer 10 is clamped tightly by both the cathode electrode 16 and the fixing component 18. Next, as shown in FIG. 2, the wafer 10 is a little bit inclined so that the wafer 10 and the liquid surface of the electrolyte fluid 22 have a small angle. The wafer 10 is dipped into the electrolyte fluid 22 slowly so that bubbles will not attach to the surface of the wafer 10. Afterward, as shown in FIG. 3, the wafer 10 is electrically connected the cathode electrode 16 for being plated. For improving the uniformity of the deposited thin film, the cathode electrode 16 normally spins so as to ensure that the wafer 10 can continually contact a fresh electrolyte fluid during the electro chemical deposition process. When an external voltage or current is applied to the plating apparatus 20, a circuit including the anode system 14, the electrolyte fluid 22, the cathode electrode 16 will conduct, and a reduction reaction occurs around the cathode electrode 16 so that the metal material is deposited on the wafer 10.

The prior art electro chemical plating process not only forms the metal material on the front side of the wafer 10, but also forms the metal material on the edge bevel of the wafer 10. However, the metal material attached to the edge bevel is actually unnecessary for the products. Pealing of the remaining metal material frequently occurs in subsequent processes due to thermal stress or other reasons, leading to the cracking of the metal material. Flakes and particles of the metal material caused by the cracking frequently fall on the lower wafers and contaminate top surfaces of the semiconductor wafers positioned under the semiconductor wafer 10 during either a chemical vapor deposition (CVD) process or the transportation of the semiconductor wafers. Thus, the performance of the products is greatly affected.

In order to avoid the above-mentioned problem, an additional removing process, an additional cleaning process and an additional drying process should be carried out to remove the metal material attached to the edge bevel after the prior art electro chemical plating process. It will not only increase the process time and the process cost, but also increases the complexity of the process. As a result, the yield of products is decreased. Referring to the electrolyte fluid 22, since the whole anode system 14, the whole wafer 10 and the whole electrode 16 should be bathed in the electrolyte fluid 22, and the wafer 10 has to be inclined when the wafer 10 is going into the electrolyte fluid 22, a huge electrolytic tank 12 and a great deal of the electrolyte fluid 22 are required for the prior art electro chemical plating process. After a period of the electro chemical plating process, the process should be paused for exchanging the electrolyte fluid 22. The old electrolyte fluid 22 should be poured out, and then the new electrolyte fluid 22 is infused into the electrolytic tank 12. Accordingly, the exchange of the electrolyte fluid 22 takes a long time and therefore reduces the output.

On the other hand, in order to perform the prior art electro chemical plating process, a single wafer 10 is first disposed between the cathode electrode 16 and the fixing component 18 by a robot arm, and is disposed into the electrolyte fluid 22 at an angle. Thereafter, the plating apparatus 20 is opened to perform the plating reaction. Next, the wafer 10 is removed from the electrolytic tank 12, and undergoes the subsequent processes, such as a cleaning process and a drying process. According to the operational limitation of the prior art plating apparatus 20, the electro chemical plating process cannot handle a great deal of wafer 10 in batch, and seriously affects the output of products. Furthermore, it is difficult for the prior art plating apparatus 20 to perform an in-situ measurement on the wafer 10. As a result, the electro chemical plating process cannot be accurately and quickly controlled, and an additional time is required for the measurement.

SUMMARY OF THE INVENTION

It is therefore a primary object of the present invention to provide a fluid-confining apparatus and its operating method so as to solve the above-mentioned problem.

According to one embodiment of the present invention, the present invention provides a fluid-confining apparatus applied for plating. The fluid-confining apparatus includes at least a substrate holder, at least a cathode electrode, at least an anode system, at least a confining fluid supplying tube, at least a confining fluid recovering tube, at least a process fluid supplying tube and at least a process fluid recovering tube. The substrate holder is applied for holding at least a semiconductor substrate. The cathode electrode is disposed around a surface of the substrate holder, adapted for electrically connecting to the semiconductor substrate. The anode system is positioned above the substrate holder, substantially corresponding to the semiconductor substrate. The anode system and the substrate holder is a reaction height apart. At least a treatment region and at least a non-treatment region are defined between the anode system and the cathode electrode. The confining fluid supplying tube and the confining fluid recovering tube are both corresponding to the non-treatment region, adapted for providing and recovering at least a confining fluid respectively. The process fluid supplying tube and the process fluid recovering tube are both corresponding to the treatment region, adapted for providing and recovering at least an electrolyte fluid respectively.

According to another embodiment of the present invention, a method of operating a fluid-confining apparatus is provided. First, at least a fluid-confining apparatus is provided. The fluid-confining apparatus includes at least a substrate holder, at least a confining fluid supplying tube and at least a confining fluid recovering tube. At least a treatment region and at least a non-treatment region are defined on the substrate holder. Subsequently, at least a semiconductor substrate is provided, and the semiconductor substrate is fixed on the substrate holder. Next, the confining fluid supplying tube and confining fluid recovering tube are opened, so that at least a confining fluid continually flows from the confining fluid supplying tube to the confining fluid recovering tube. The confining fluid flows the non-treatment region of the fluid-confining apparatus. Thereafter, at least a process fluid is supplied. The process fluid contacts the treatment region of the fluid-confining apparatus, and the process fluid does not dissolve in the confining fluid.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
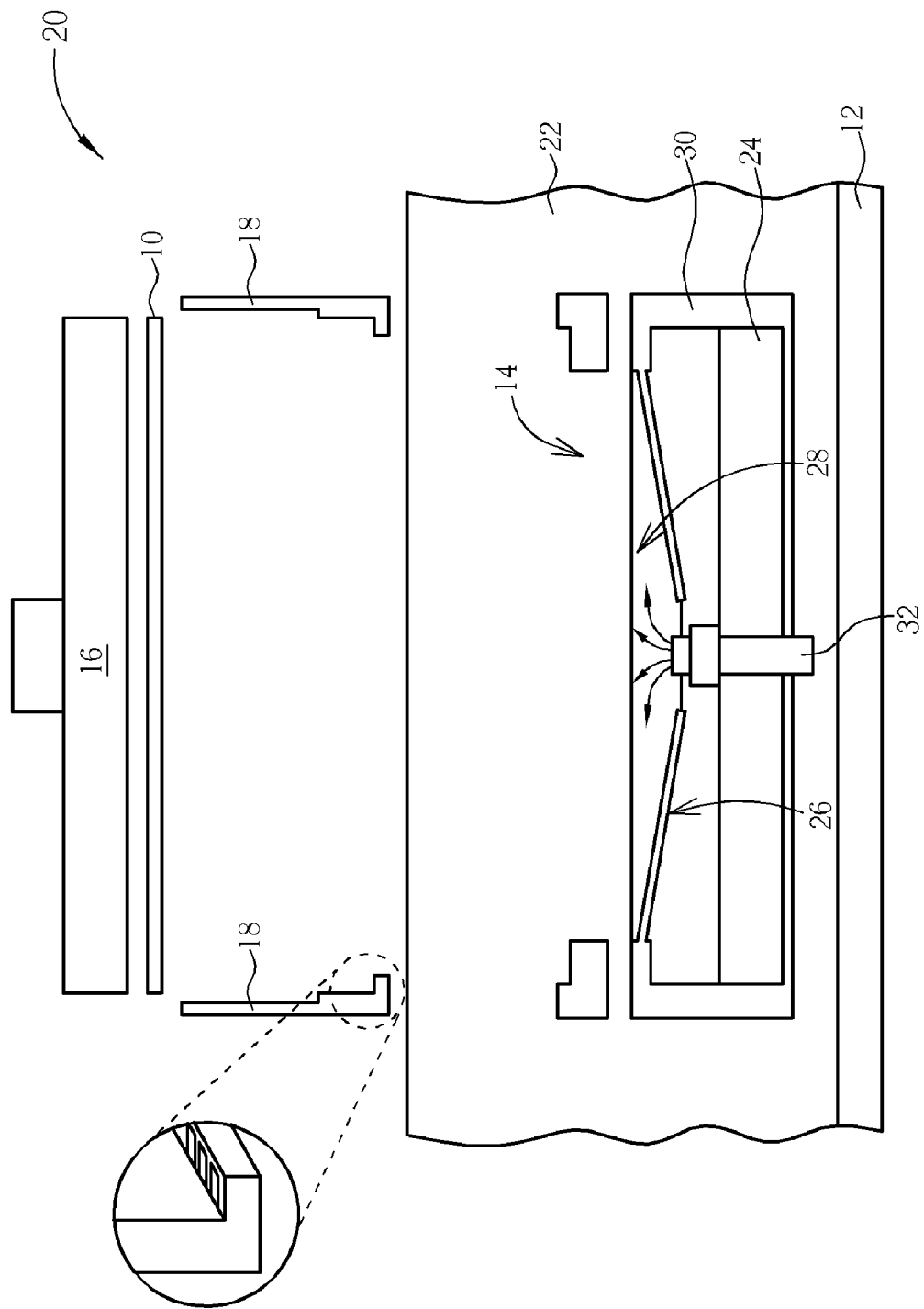
FIG. 1 through FIG. 3 are schematic diagrams illustrating a prior art electro chemical plating process.
Figure 2:
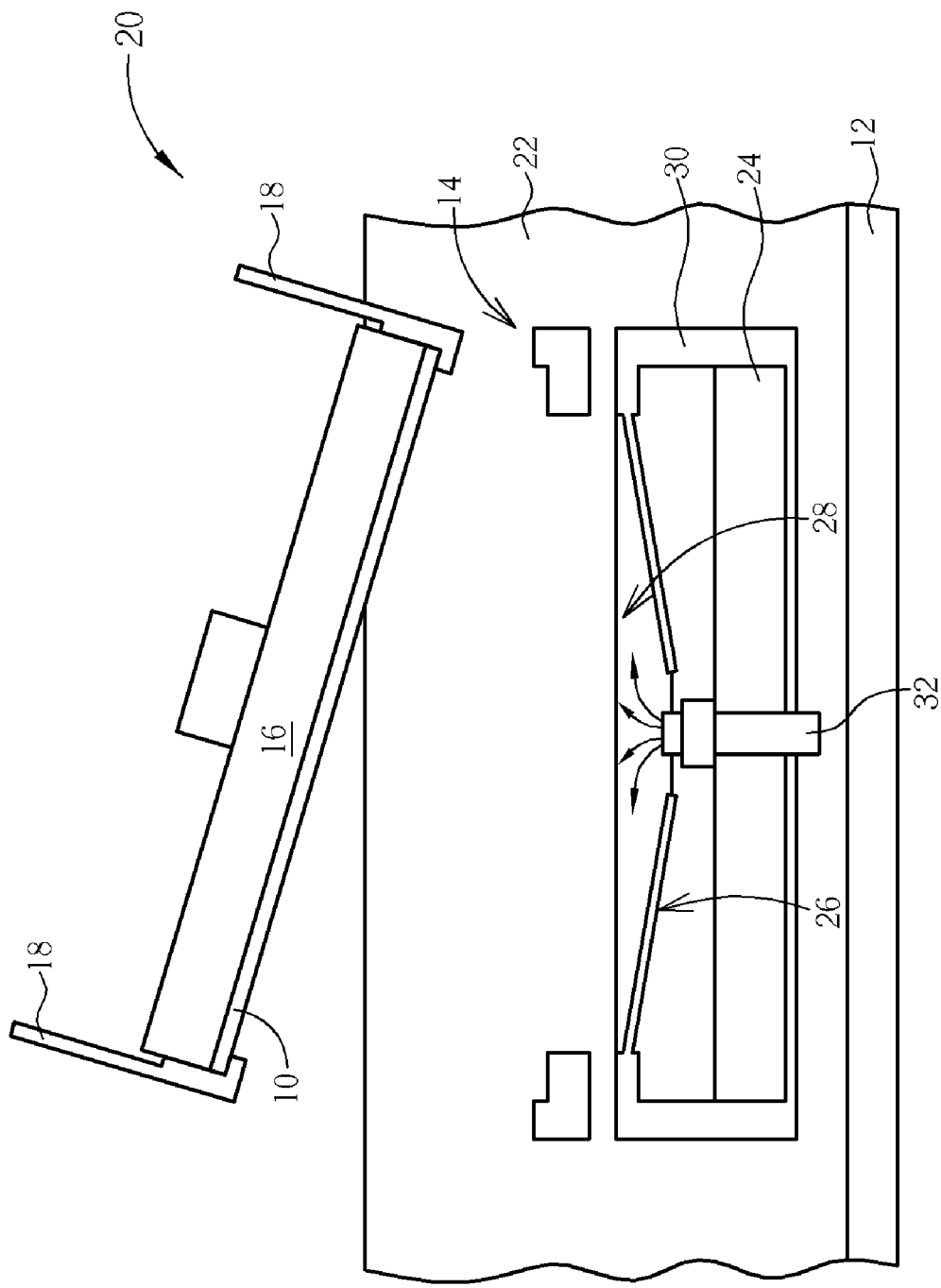
Figure 3:
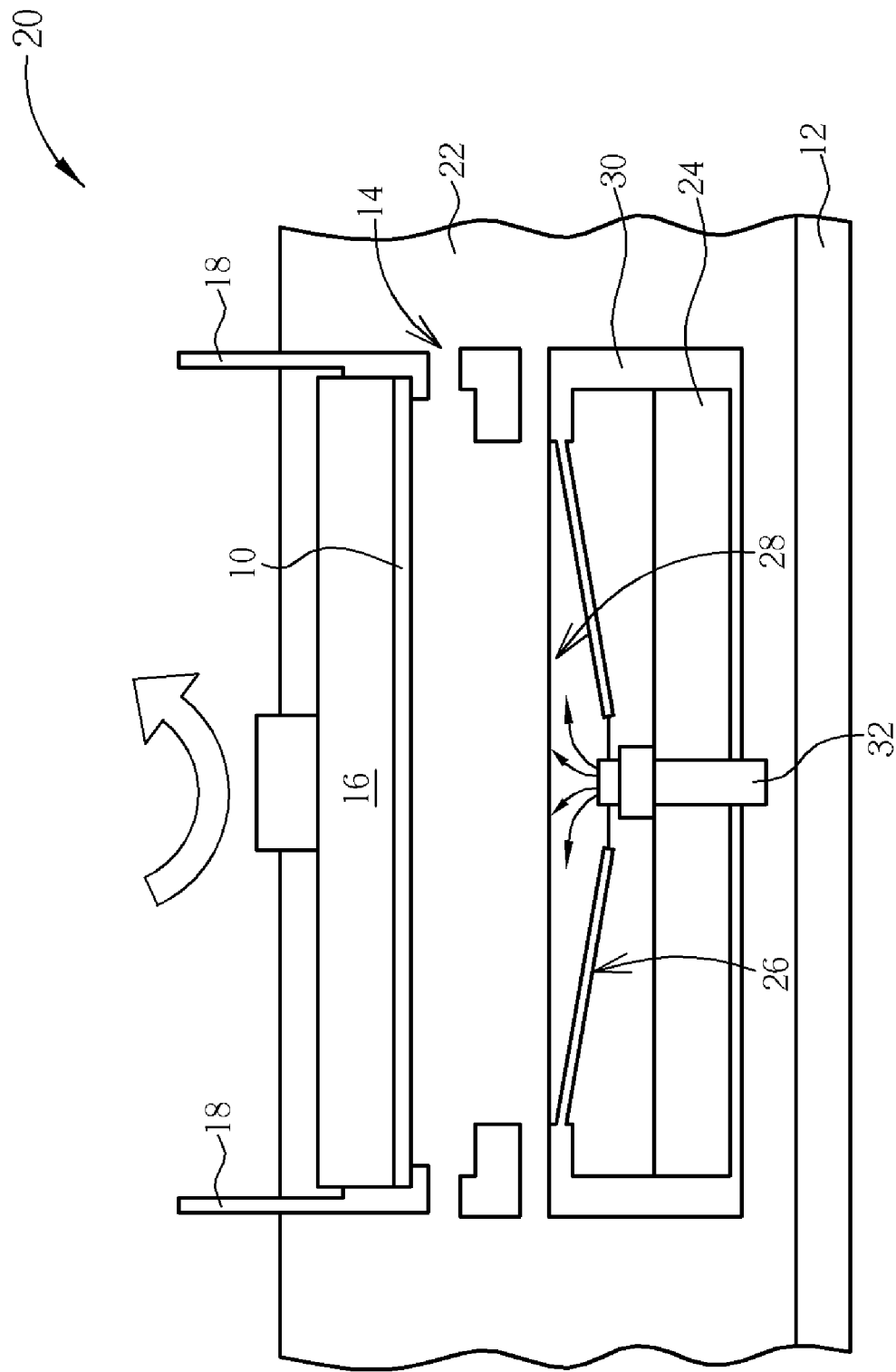
Figure 4:
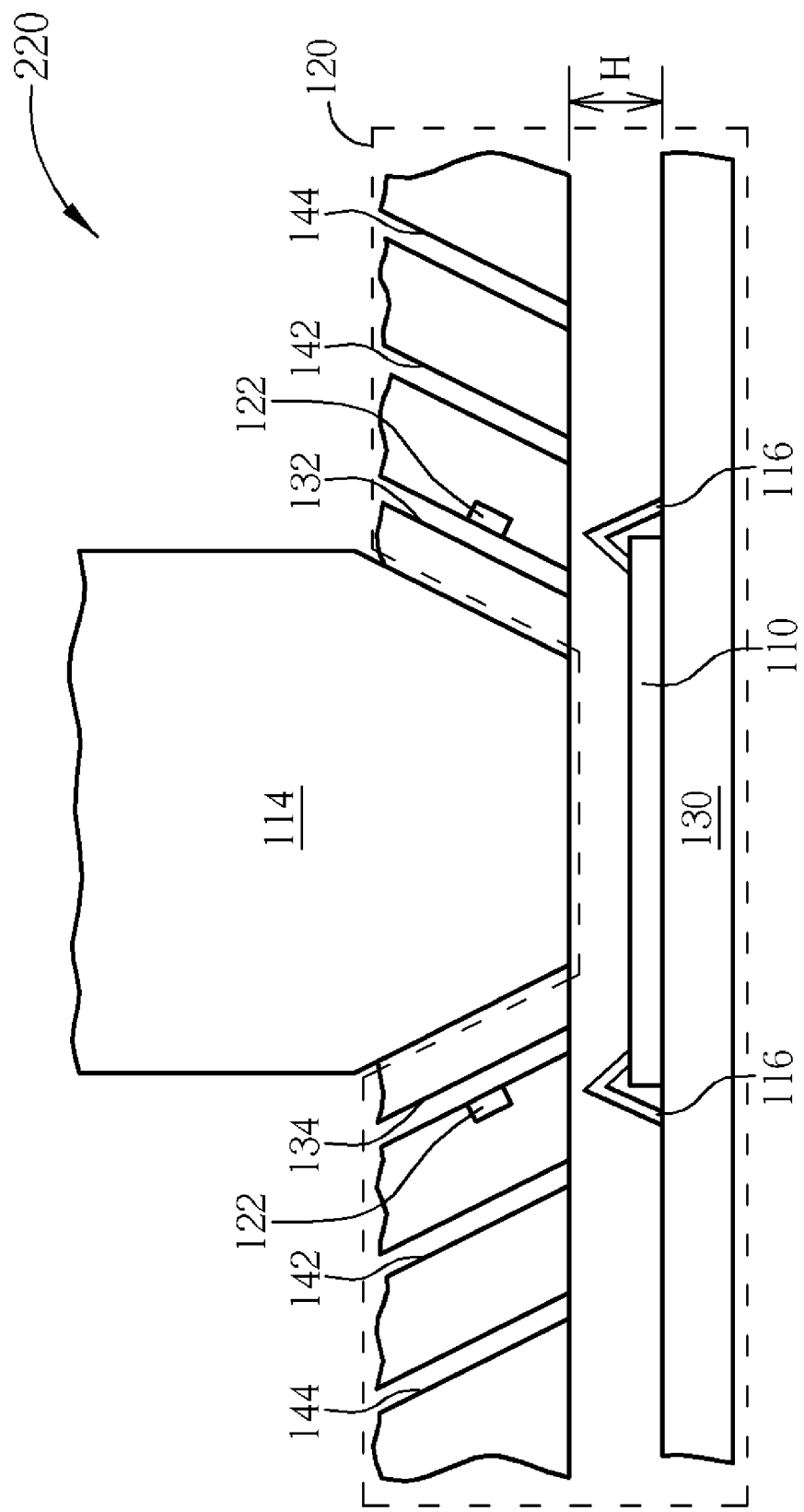
FIG. 4 is a schematic cross-sectional diagram illustrating a fluid-confining apparatus according to a first preferred embodiment of the present invention.
Figure 5:
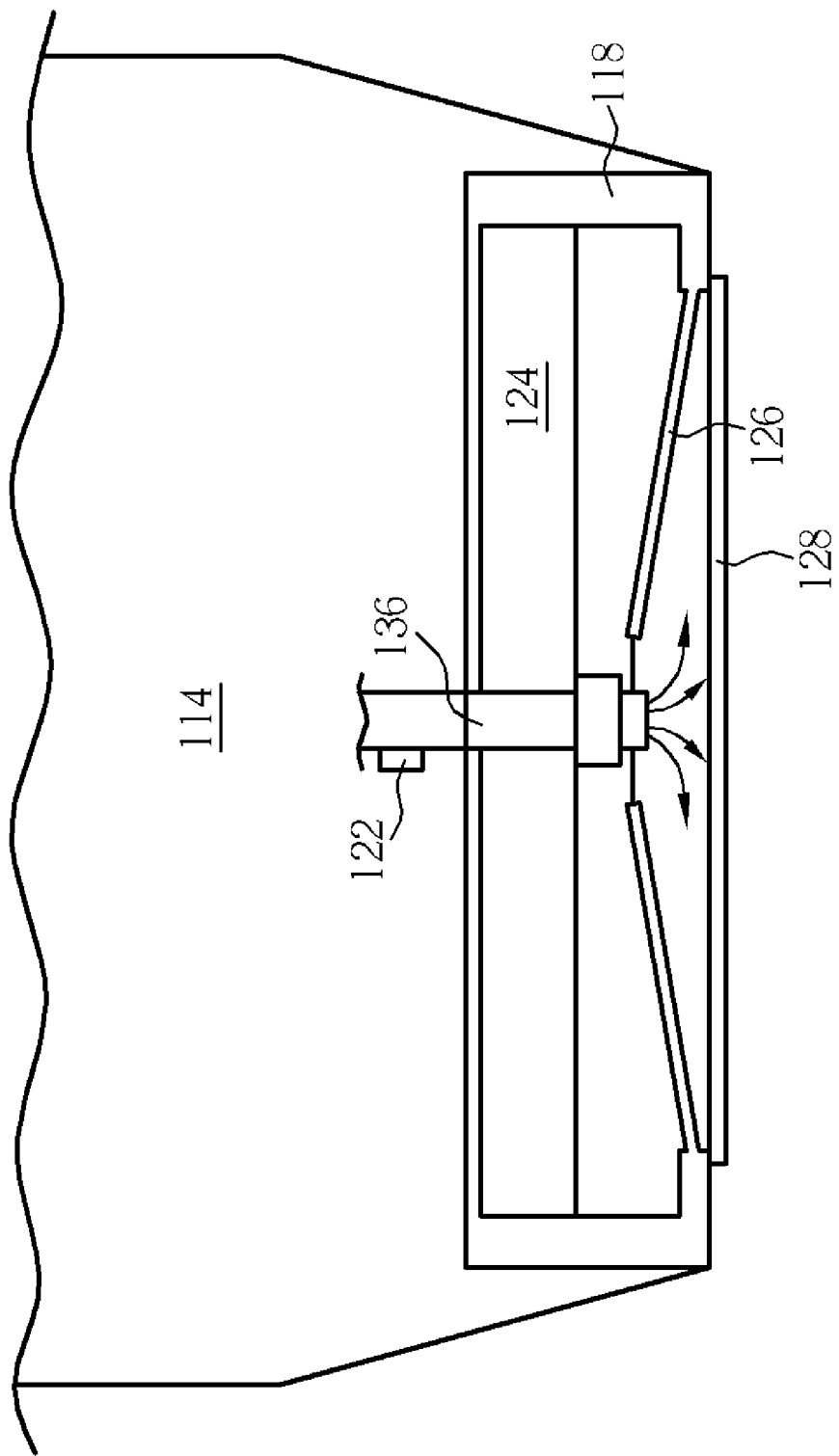
FIG. 5 is a schematic cross-sectional diagram illustrating the anode system shown in FIG. 4.

Please refer to FIG. 4 and FIG. 5. FIG. 4 is a schematic cross-sectional diagram illustrating a fluid-confining apparatus 220 applied for plating according to a first preferred embodiment of the present invention, and FIG. 5 is a schematic cross-sectional diagram illustrating the anode system 114 shown in FIG. 4, where like number numerals designate similar or the same parts, regions or elements. It is to be understood that the drawings are not drawn to scale and are served only for illustration purposes. As shown in FIG. 4, a fluid-confining apparatus 220 applied for plating is provided in this embodiment. The fluid-confining apparatus 220 includes a fluid-confining system 120 and an anode system 114. The fluid-confining system 120 includes a substrate holder 130, a cathode electrode 116, at least a first tube 132, at least a second tube 134, at least a third tube 142 and at least a fourth tube 144.

The anode system 114 is disposed above the substrate holder 130, and is substantially corresponding to the semiconductor substrate 110. The anode system 114 and the substrate holder 130 are a reaction height H apart. On one hand, the anode system 114 can provide a required voltage for the plating reaction. On the other hand, the anode system 114 can help the fluid-confining apparatus 220 to control the height that the process fluid occupies. For the fluid-confining apparatus 220, the anode system 114 can be a rotary system or a fixed system. In other words, relative to the substrate holder 130, the anode system 114 can take a rotation, or can keep in a fixed position. In addition, the substrate holder 130 can also rotate, or keep in a fixed position. As shown in FIG. 5, the anode system 114 can include an anode electrode 124, and can optionally include at least a fifth tube 136 and a sensor 122. In another embodiment, the anode system 114 can include a detector (not shown in the drawing). Furthermore, the anode system 114 can also include other components, such as an anode chamber 118, a filter membrane 126 or a diffuser membrane 128.

Figure 6:
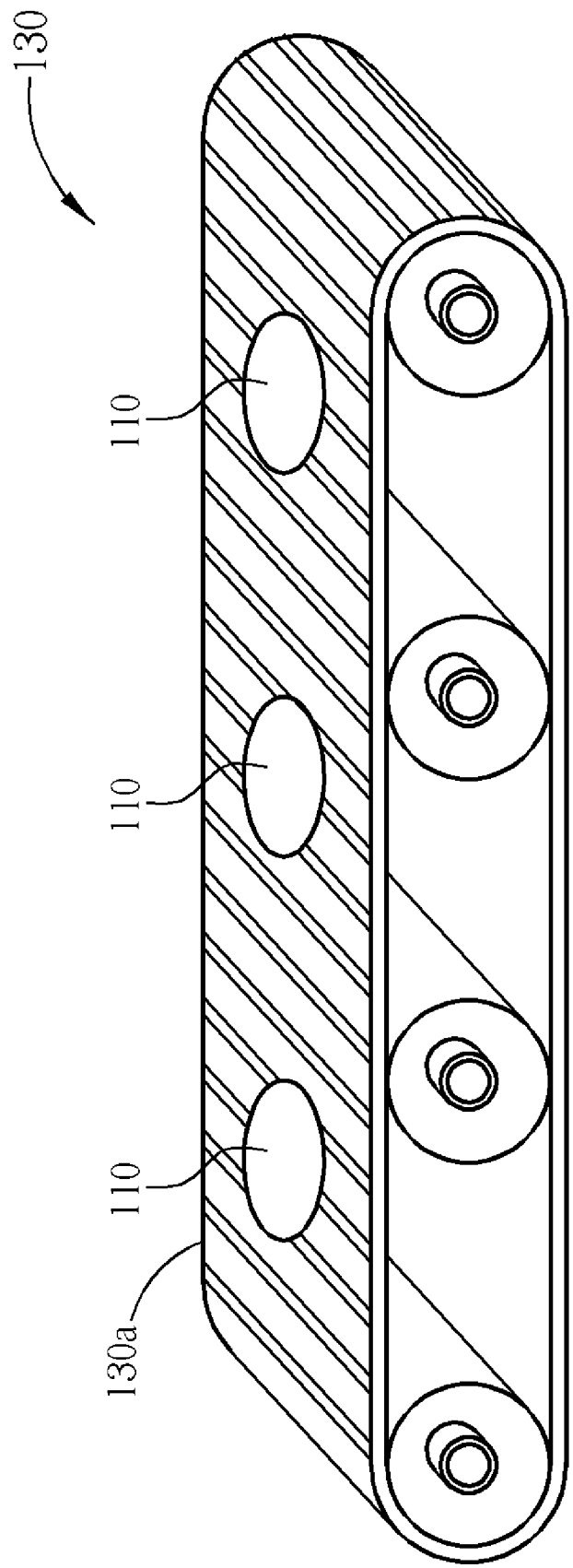
FIG. 6 and FIG. 7 are schematic diagrams illustrating the substrate holder shown in FIG. 4.
Figure 7:
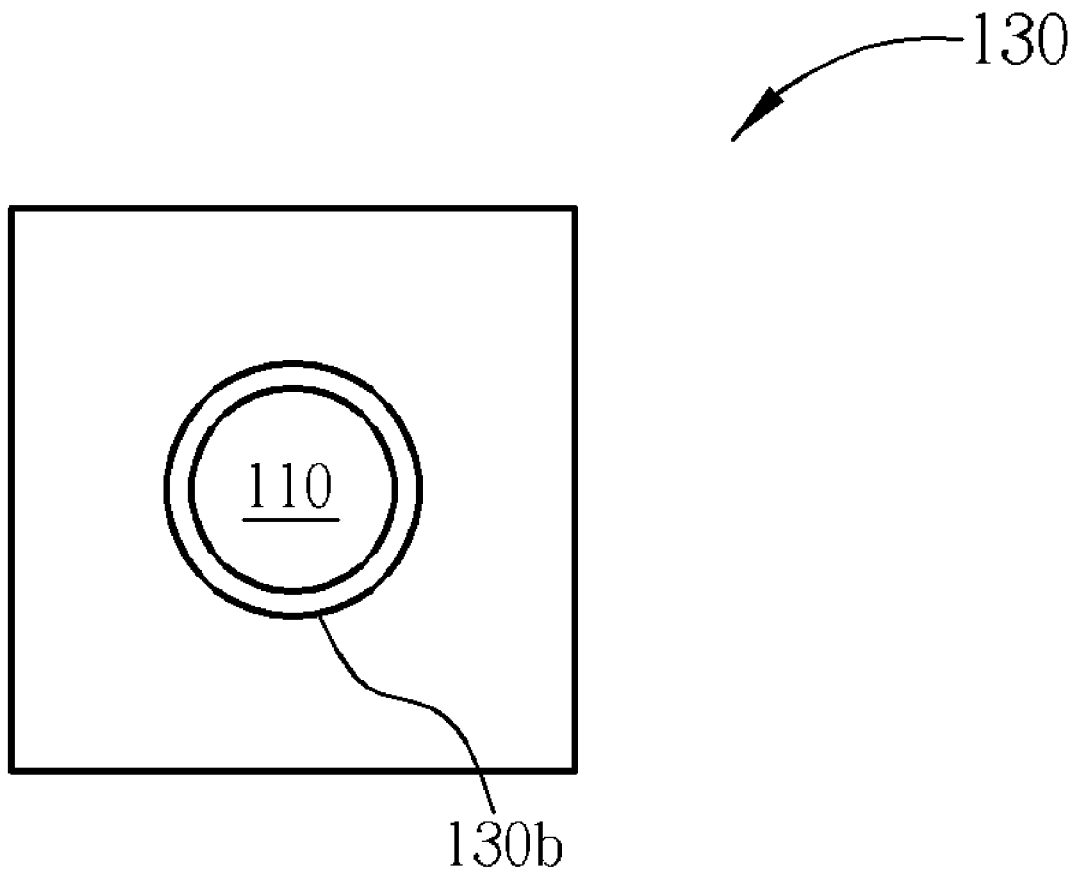

The substrate holder 130 is applied for holding at least a semiconductor substrate 110. The substrate holder 130 of the present invention can have a belt type structure or a ring type structure, as shown in FIG. 6 and FIG. 7. The substrate holder 130 shown in FIG. 6 has a conveying belt 130a so that numerous semiconductor substrates 110, which wait to be processed, can be transferred into the fluid-confining apparatus 220 through the substrate holders 130. The substrate holder 130 of FIG. 7 has at least a ring type structure 130b so as to place the semiconductor substrates 110 that need to be treated. It should be noticed that the substrate holder 130 could have a ring type structure and a conveying belt in the meantime (not shown in the drawing). The ring type structure can be applied for holding the semiconductor substrate 110, and the conveying belt can be applied for transferring the ring type structure and the semiconductor substrate 110.

Figure 8:
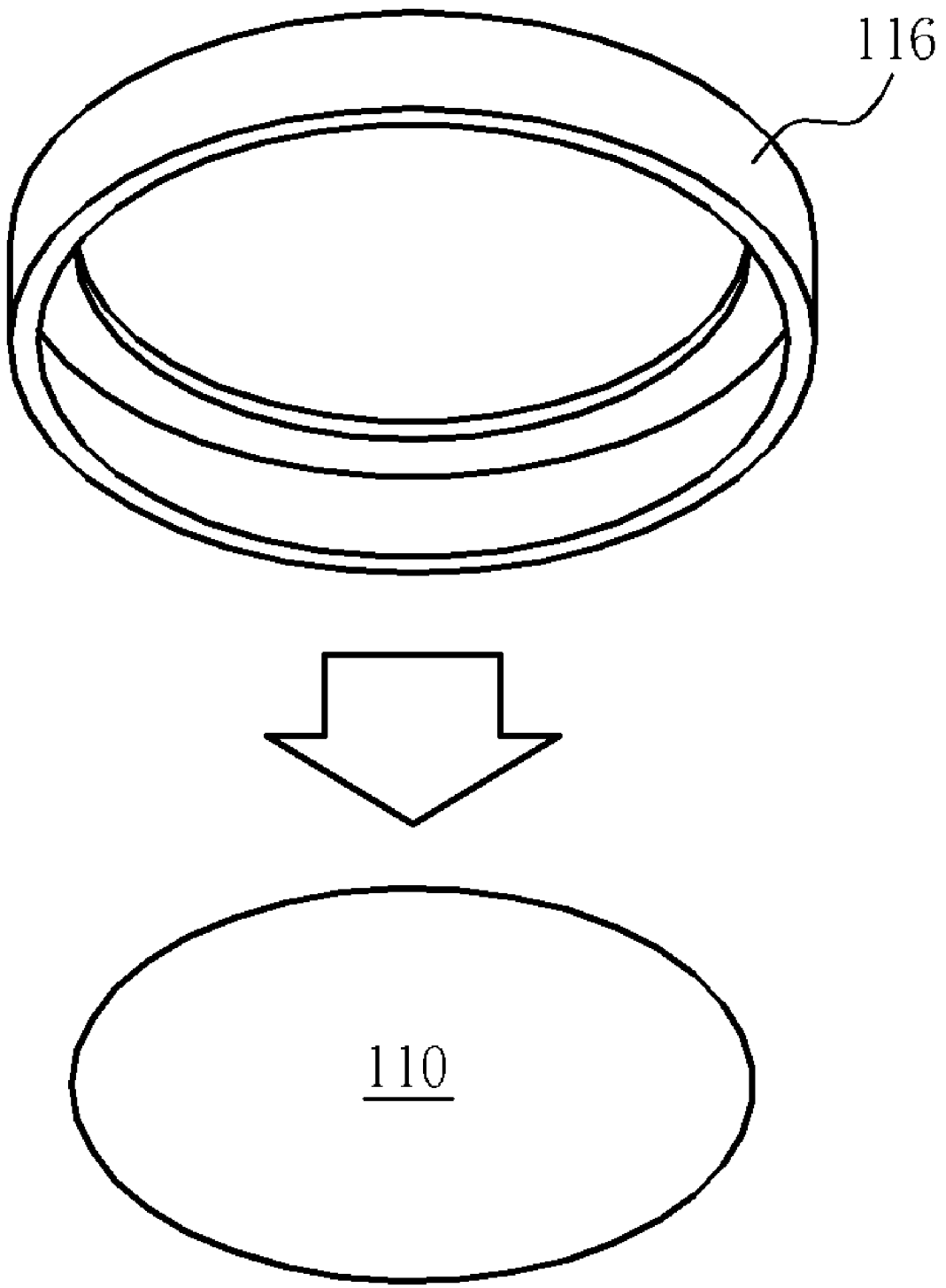
FIG. 8 and FIG. 9 are schematic diagrams illustrating the cathode electrode shown in FIG. 4.
Figure 9:
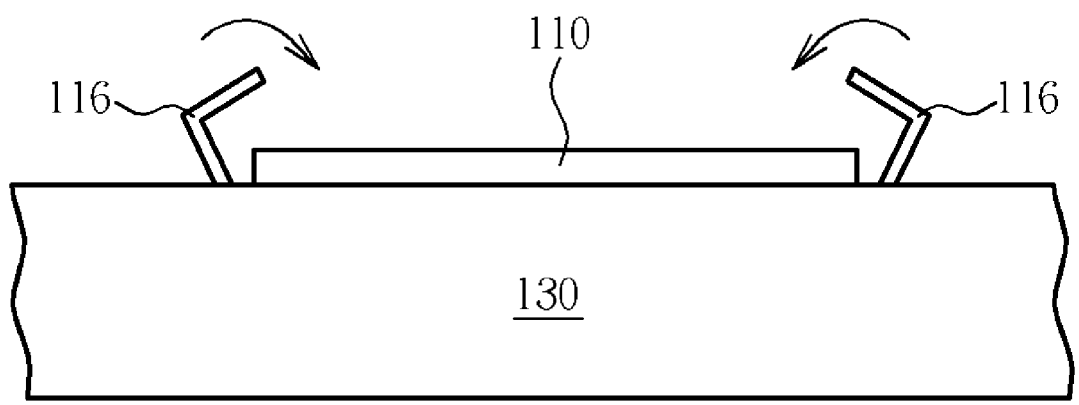

The cathode electrode 116 is disposed on a surface of the substrate holder 130, and can be electrically connected to the semiconductor substrate 110. In the fluid-confining apparatus 220, the cathode electrode 116 can also be a fixing component to fix the semiconductor substrate 110 in a predetermined position of the substrate holder 130 in this embodiment. In light of this, the cathode electrode 116 can have an electrostatic chuck (e-chuck), a vacuum chuck, a ring type structure or a clamp type structure, as shown in FIG. 8 and FIG. 9. The cathode electrode 116 shown in FIG. 8 can move from a position above the semiconductor substrate 110 toward the semiconductor substrate 110 so as to fix the semiconductor substrate 110 to the surface of the substrate holder 130. The cathode electrode 116 shown in FIG. 9 can be fixed to the substrate holder 130, and clamps the semiconductor substrate 110 from the side of the semiconductor substrate 110 toward the center of the semiconductor substrate 110. A treatment region (not shown in the drawing) and a non-treatment region (not shown in the drawing) are defined on the substrate holder 130, and in a space between the anode system 114 and the cathode electrode 116. A portion of the semiconductor substrate 110, which will be disposed in the treatment region, will undergo the plating process, and a portion of the semiconductor substrate 110, which will be disposed in the non-treatment region, will not undergo the plating process.

Figure 10:
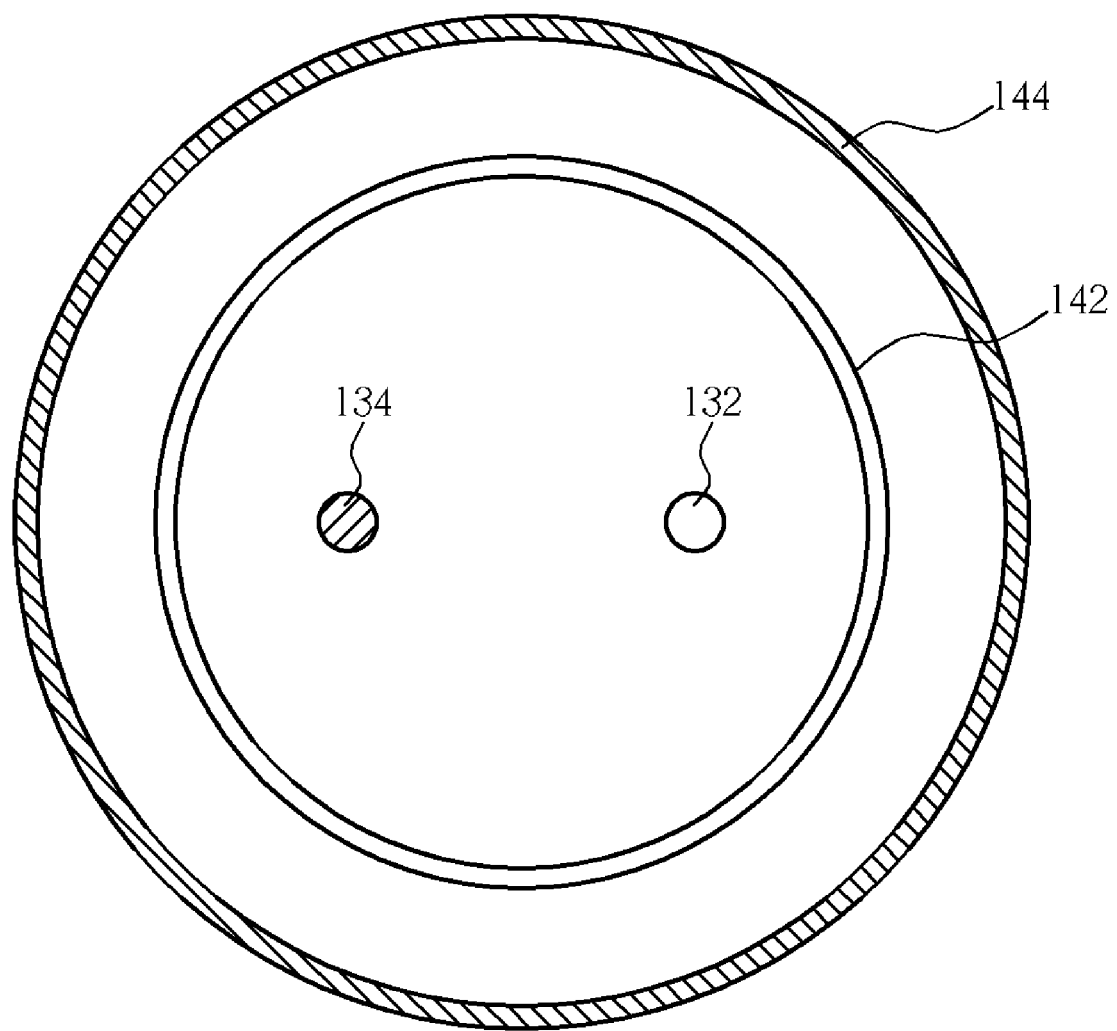
FIG. 10 through FIG. 12 are schematic cross-sectional diagrams illustrating the tubes shown in FIG. 4.

The first tube 132, the second tube 134, the third tube 142 and the fourth tube 144 are all disposed around the anode system 114 to provide or recover the needed substances, such as chemical substances, additives, deionized water, gases, or the confining fluid. Relative to the semiconductor substrates 10 that waits to be treated, the third tube 142 and the fourth tube 144 are disposed outside the first tube 132 and the second tube 134. The first tube 132, the second tube 134, the third tube 142 and the fourth tube 144 can have any possible shape. For instance, the cross-sections of the above-mention tubes might be a circle, a semicircle, an arc, an ellipse, a rectangle, a polygon, and so on. Taking the structure shown in FIG. 10 as an example, the first tube 132 and the second tube 134 shown in FIG. 10 are both circular pipes, while the cross-section of the third tube 142 and the cross-section of the fourth tube 144 are arcs.

Figure 11:
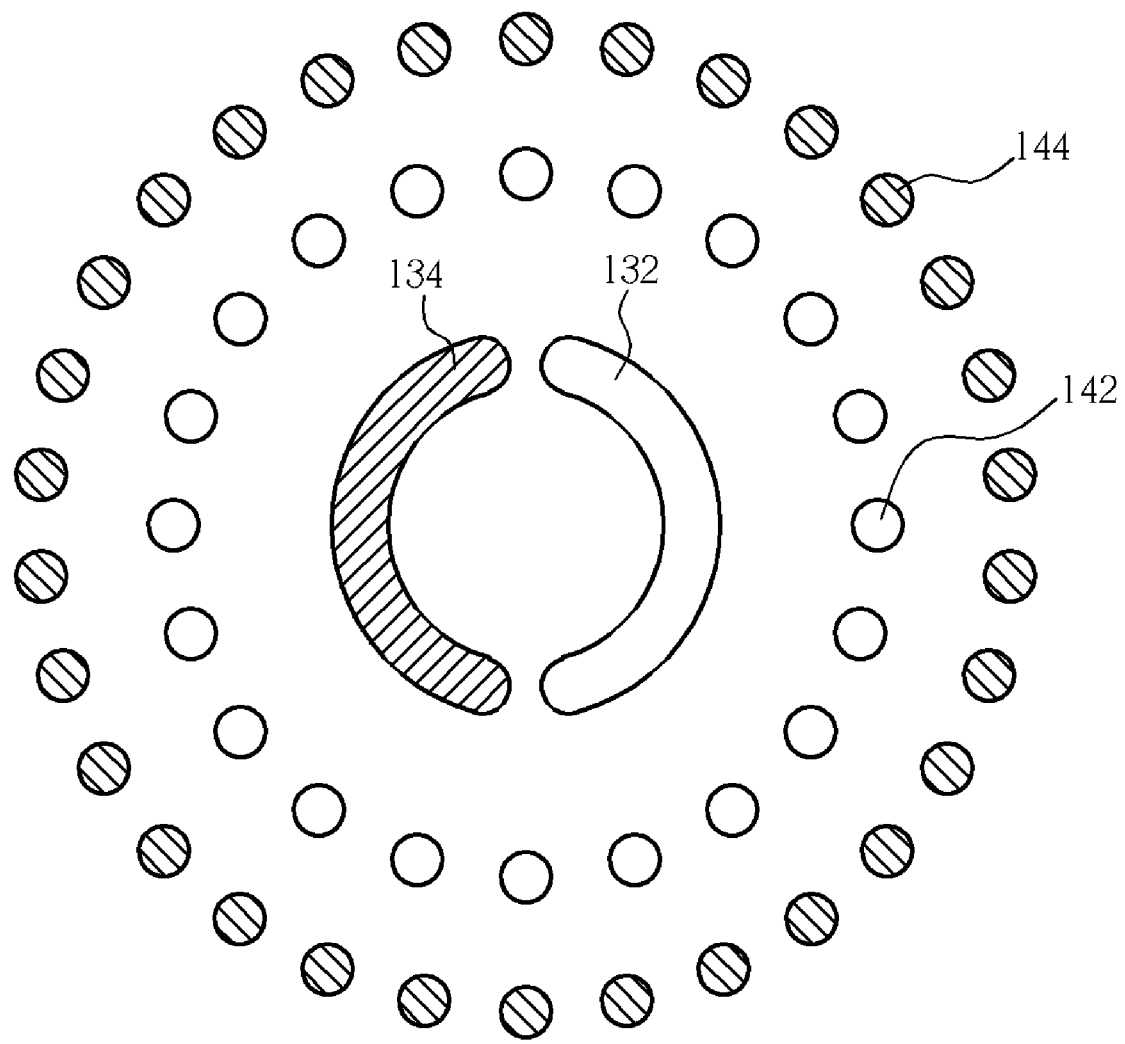
Figure 12:
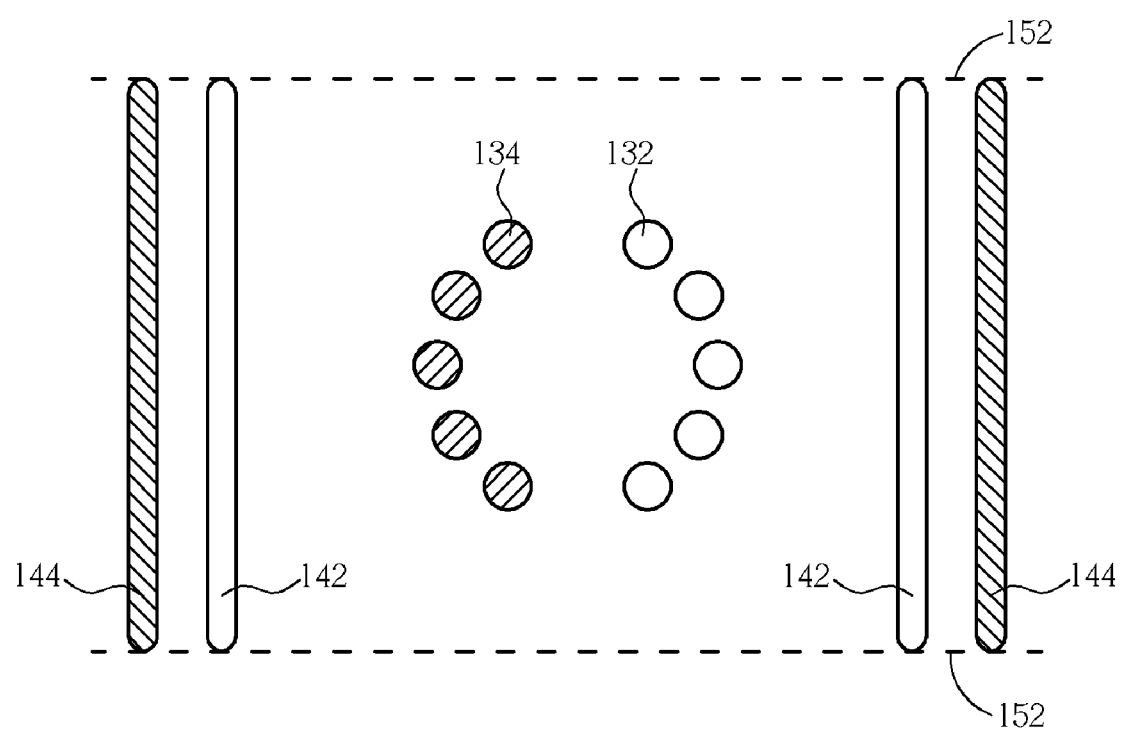

In addition, the fluid-confining apparatus in the present invention can also include a plurality of first tubes 132, a plurality of second tubes 134, a plurality of third tubes 142, or a plurality of fourth tubes 144. The numerous tubes can be arranged in any shape, such as a circle, a semicircle, an arc, an ellipse, a straight line or a rectangle. For instance, as shown in FIG. 11, the first tube 132, the second tube 134, the third tubes 142 and the fourth tubes 144 are all circular pipes, while the third tubes 142 and the fourth tubes 144 are arranged in a circular pattern respectively. On other hand, as shown in FIG. 12, when the fluid-confining apparatus 220 includes sidewalls 152 on the substrate holder 130, the third tubes 142 and the fourth tubes 144 can have linear shapes in the cross-sections respectively, and can be parallel with each other. It should be noted that all the tubes shown in the drawings incline toward the center of the semiconductor substrate 110, as shown in FIG. 4. However, the present invention should not be limited thereto. The fluid-confining apparatus 220 in the present invention can be arranged perpendicular to the front side of the semiconductor substrate 110, can incline toward the surroundings, or even be arranged parallel with the front side of the semiconductor substrate 110.

Figure 13:
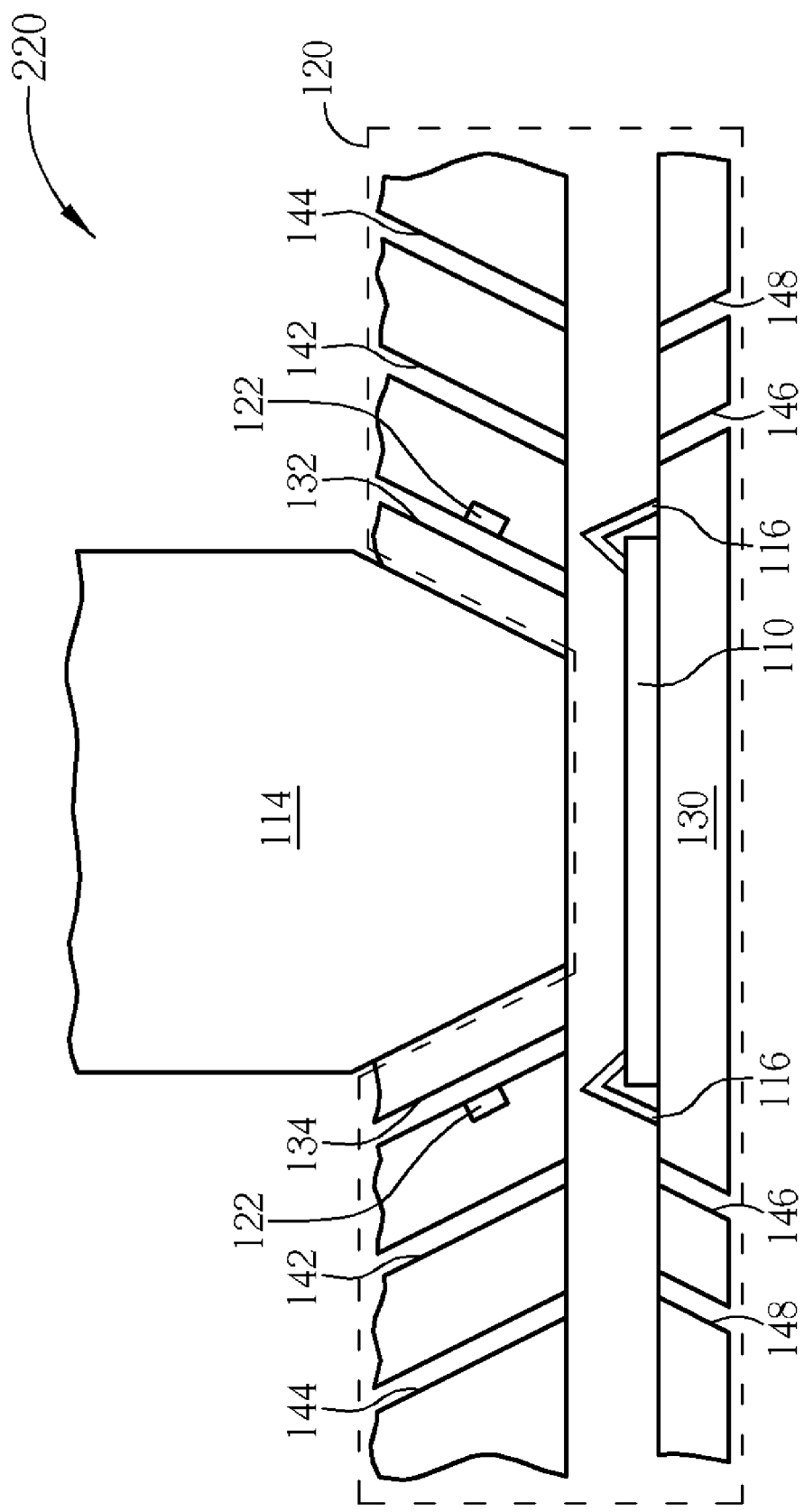
FIG. 13 is a schematic cross-sectional diagram illustrating another fluid-confining apparatus according to the first preferred embodiment of the present invention.

In addition to the inner part of the anode system 114, any portion of the fluid-confining apparatus 220 can include a tube. As shown in FIG. 13, the fluid-confining system 120 can further include at least a sixth tube 146 and at least a seventh tube 148. The sixth tube 146 and the seventh tube 148 are disposed in the substrate holder 130, and around the semiconductor substrate 110. Similar to the above-mentioned tubes, the cross-section of the sixth tube 146 and the cross-section of the seventh tube 148 might be any possible shape, while a plurality of sixth tubes 146 and a plurality of the seventh tubes 148 can be arranged in any possible pattern. The fluid-confining apparatus 220 can control the on/off state of the first tube 132, the second tube 134, the third tube 142, the fourth tube 144, the fifth tube 136, the sixth tube 146 and the seventh tube 148 by valves of these tubes or by the various fluid pressures in these tubes. In addition, the fluid-confining apparatus 220 can also control the kind of flowing fluid, the flowing direction, the flow rate in each tube, and even controls the angle and position of each tube.

In addition to the inner part of the anode system 114, a detector or various sensors 122, such as a temperature sensor, a flow rate sensor, or a sensor system for measuring the surface condition of the wafer (the wafer flatness or the thickness), can be included in any portion of the fluid-confining apparatus 220 in practice. For example can be included. For example, a sensor 122 can be included in the first tube 132, and another sensor 122 can be included in the second tube 134. An in-situ measurement for the process condition or for the process fluid can be performed by these sensors during the process, so the process condition can be accurately and quickly controlled. Thus, the process condition or the quality of process fluid can be fed back automatically, and therefore can be immediately adjusted.

Figure 14:
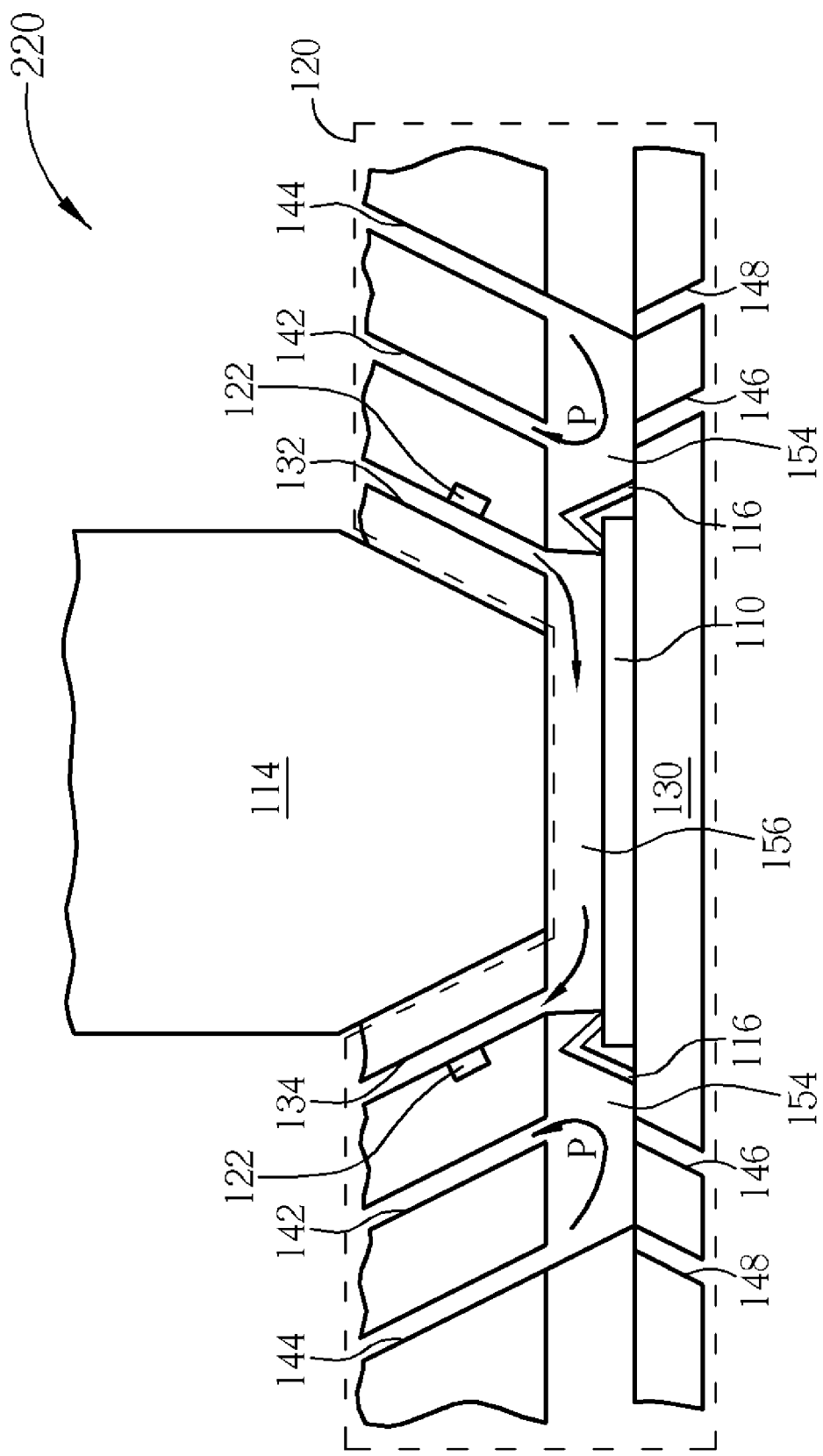
FIG. 14, which is a schematic diagram illustrating an operating method of the fluid-confining apparatus shown in FIG. 13.

In order to emphasize the characteristic of the present invention, an operating method of the present invention is explained while the fluid-confining apparatus 220 is applied to an electro chemical plating process. Please refer to FIG. 14, which is a schematic diagram illustrating an operating method of the fluid-confining apparatus 220 applied for plating shown in FIG. 13, where like number numerals designate similar or the same parts, regions or elements. As shown in FIG. 14, the fluid-confining apparatus 220 shown in FIG. 13 is first provided. Subsequently, at least a semiconductor substrate 110 is provided. The semiconductor substrate 110 is fixed on the substrate holder 130 by the cathode electrode 116 or other fixing components. The semiconductor substrate 110 can be a wafer, a silicon substrate or a silicon-on-insulator (SOI) substrate. In this embodiment, the semiconductor substrate 110 is a wafer. Because the front side of the wafer should undergo the plating process, and the edge bevel of the wafer should not undergo the plating process, the front side of the wafer should be corresponding to the treatment region 102 of the fluid-confining apparatus 220, while the edge bevel of the wafer should be corresponding to the non-treatment region 104 of the fluid-confining apparatus 220. The front side of the wafer can be positioned face-up, and toward the anode system 114.

Next, the third tube 142 and the fourth tube 144 are opened so that a confining fluid 154 continually flows from the fourth tube 144 to the third tube 142, where the sixth tube 146 and the seventh tube 148 are closed. The confining fluid 154 is applied to confine the process fluid, such as the chemical substance or the cleaning fluid, so that the process fluid will not contact the portion of the semiconductor substrate 110 that should not undergo the plating process. For example, the confining fluid 154 can contain an inert gas, such as nitrogen gas. The fourth tube 144 and the third tube 142 are both disposed around the semiconductor substrate 110, are applied to provide and recover the confining fluid 154 respectively. A path for the confining fluid flowing from the fourth tube 144 to the third tube 142 is a flowing path P. According to the arrangements of the third tube 142 and the fourth tube 144, the confining fluid 154 flows the non-treatment region of the fluid-confining apparatus 220.

Thereafter, the first tube 132 and the second tube 134 are opened so that an electrolyte fluid 156 continually flows from the first tube 132, and is recovered by the second tube 134. The electrolyte fluid 156 is the process fluid in the electro chemical plating process. The first tube 132 and the second tube 134 are applied for providing and recovering the electrolyte fluid 156 respectively, and are disposed between the semiconductor substrate 110 and the flowing path P of the confining fluid 154. In order to make the electrolyte fluid 156 and the confining fluid 154 to flow continuously, a pump can be included inside or outside the fluid-confining apparatus 220, functioning as a power source, but should not be limited thereto. In other embodiments of the present invention, the process fluid does not have to be provided and recovered continuously. First, a certain amount of the process fluid may be provided to help the reaction. The process fluid might be recovered thereafter, or a new process fluid might be provided thereafter in according to the process condition.

Because it is hard for the electrolyte fluid 156 and the confining fluid 154 to dissolve in each other, the confining fluid 154 can control the flowing space of the electrolyte fluid 156. Thus, the electrolyte fluid 156 will not contact the portion of the semiconductor substrate 110 that should not undergo the process, and only contacts the portion of the semiconductor substrate 110 that should undergo the process. Accordingly, the fluid-confining apparatus 220 can control the occupied space of the electrolyte fluid 156 by means of controlling the flow rate of the confining fluid 154, the flow rate of the electrolyte fluid 156, the position of each tube, and the angle of each tube.

The anode electrode 124 and the cathode electrode 116 can be electrically connected to the different voltages respectively after or before the electrolyte fluid 156 flows into the fluid-confining apparatus 220. Thus, a circuit including the anode electrode 124, the electrolyte fluid 156, and the cathode electrode 116 conducts, and a reduction reaction occurs around the cathode electrode 116 so that the metal material is deposited on the front side of the semiconductor substrate 110.

In the above-mentioned condition, the confining fluid 154 and the electrolyte fluid 156 will not react with each other. The reason that confining fluid 154 can confine the position and the shape of the electrolyte fluid 156 is that the confining fluid 154 and the electrolyte fluid 156 do not dissolve in each other. In the present invention, the process fluid or the confining fluid can flow in liquid state, gas state, vapor state, or gel state. For example, the electrolyte fluid 156 can flow in liquid state, and the confining fluid 154 can be in gas state. In another embodiment, the electrolyte fluid 156 and the confining fluid 154 can both flow in liquid state. The confining fluid 154 can even include a supercritical fluid, such as carbon dioxide. In other embodiments of the present invention, the confining fluid 154 can further include a variety of substances so as to help the process operation or to assist in controlling the electrolyte fluid 156. For instance, the confining fluid 154 can include an ionized gas, a hot gas or a cold gas so as to change the process temperature, the temperature of the electrolyte fluid 156, or the characteristics of the electrolyte fluid 156. Thus, the confining fluid 154 not only maintains the shape and the position of the process fluid, but also enhances the process. The confining fluid 154 can even remove residues positioned on the semiconductor substrate 110.

It is a characteristic of the present invention that a confining fluid is applied to confine the process fluid into a predetermined space and to keep the process fluid in a predetermined position in place of the prior art tank. For the above-mentioned purpose, the confining fluid and the process fluid should not dissolve in each other. The process fluid might be confined by the flowing path P of the confining fluid, by a magnetic force between the confining fluid and the process fluid, by an electric force between the confining fluid and the process fluid. In light of this, the confining fluid 154 can include a magnetic substance, a charged substance, a magneto-rheological fluid (MRF), an electro-rheological fluid (ERF), or even a solid particle. Accordingly, the fluid-confining apparatus 220 can control the characteristics of the confining fluid 154 or the characteristics of the electrolyte fluid 156 by magnetic force or by electric force, so the position of the electrolyte fluid 156 is controlled.

The above-mentioned operating method is merely one of the various operating methods of the present invention, the actual flowing paths of the confining fluid 154 and the electrolyte fluid 156 be adjusted according to the process. In other words, the confining fluid 154 and the electrolyte fluid 156 can be supplied in any possible tube, and can be recovered in any appropriate tube. Please refer to FIG. 15 to FIG. 18, which are schematic diagrams illustrating other operating methods of the fluid-confining apparatus 220 applied for plating shown in FIG. 13, where like number numerals designate similar or the same parts, regions or elements. The operating methods shown in FIG. 15 to FIG. 18 can also be applied to an electro chemical plating process. The main differences among these operating methods lie in the flowing tubes for the confining fluid 154 and the electrolyte fluid 156.

Figure 15:
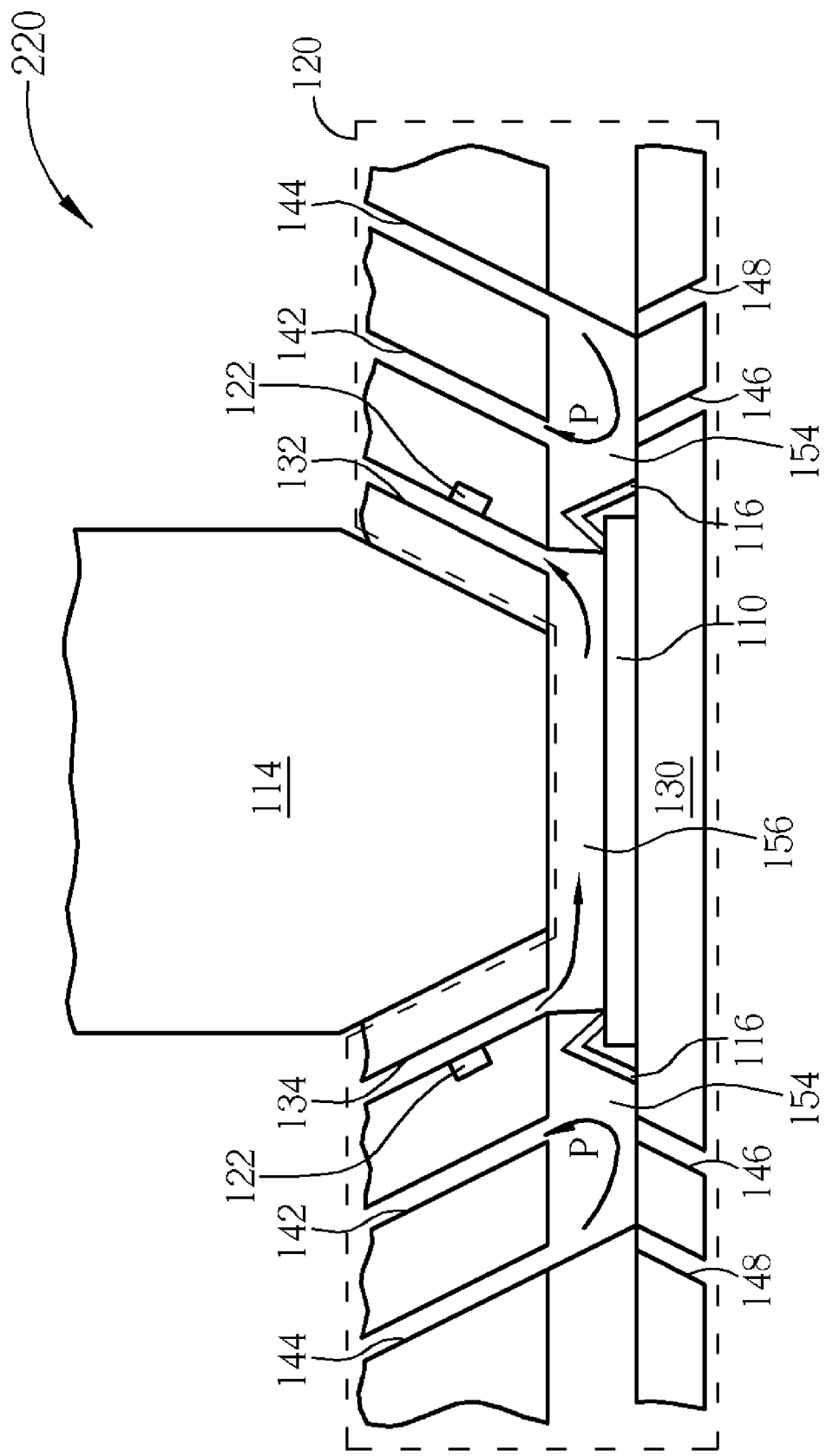
FIG. 15 through FIG. 18 are schematic diagrams illustrating other operating methods of the fluid-confining apparatus shown in FIG. 13.
Figure 16:
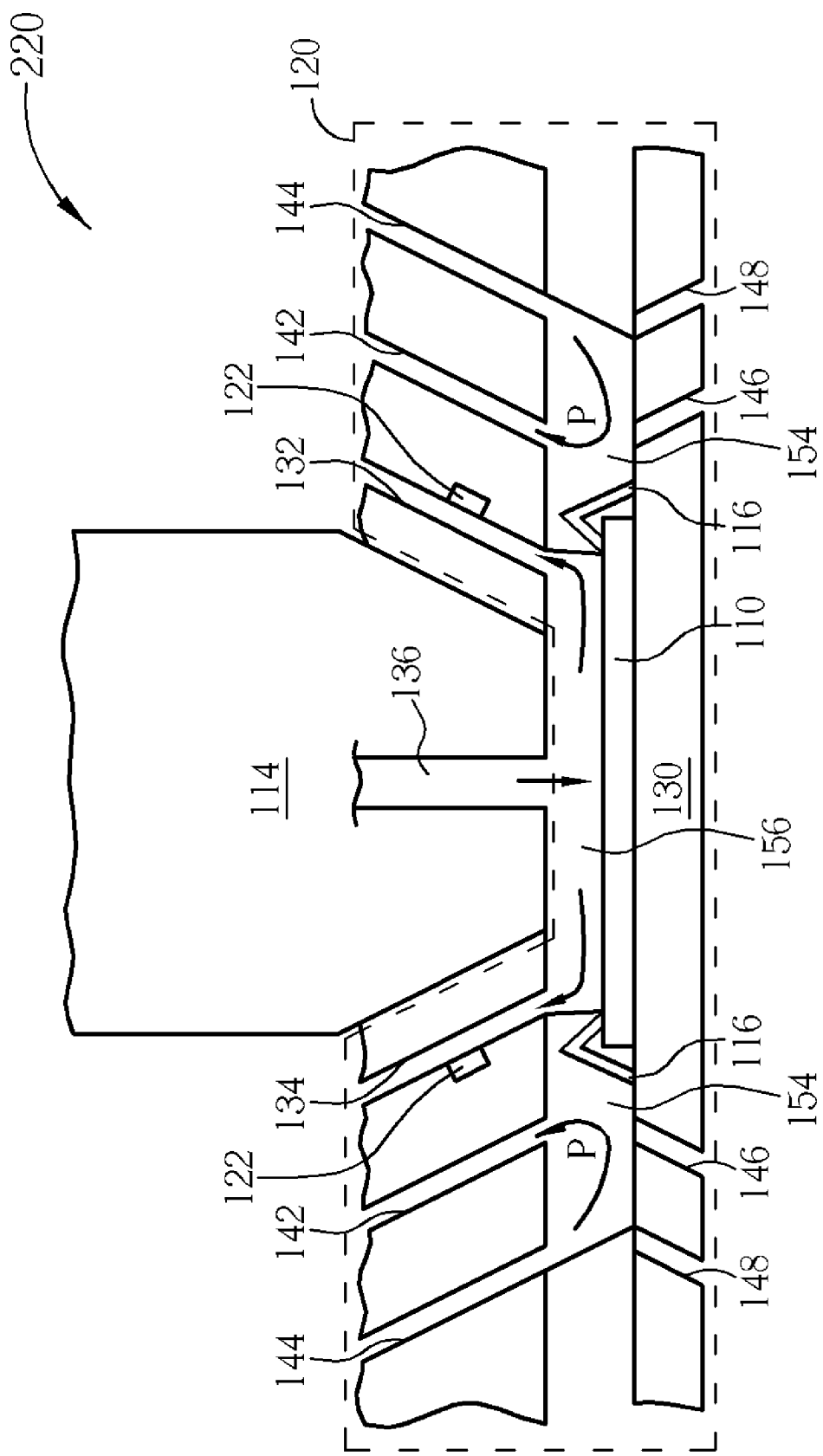
Figure 17:
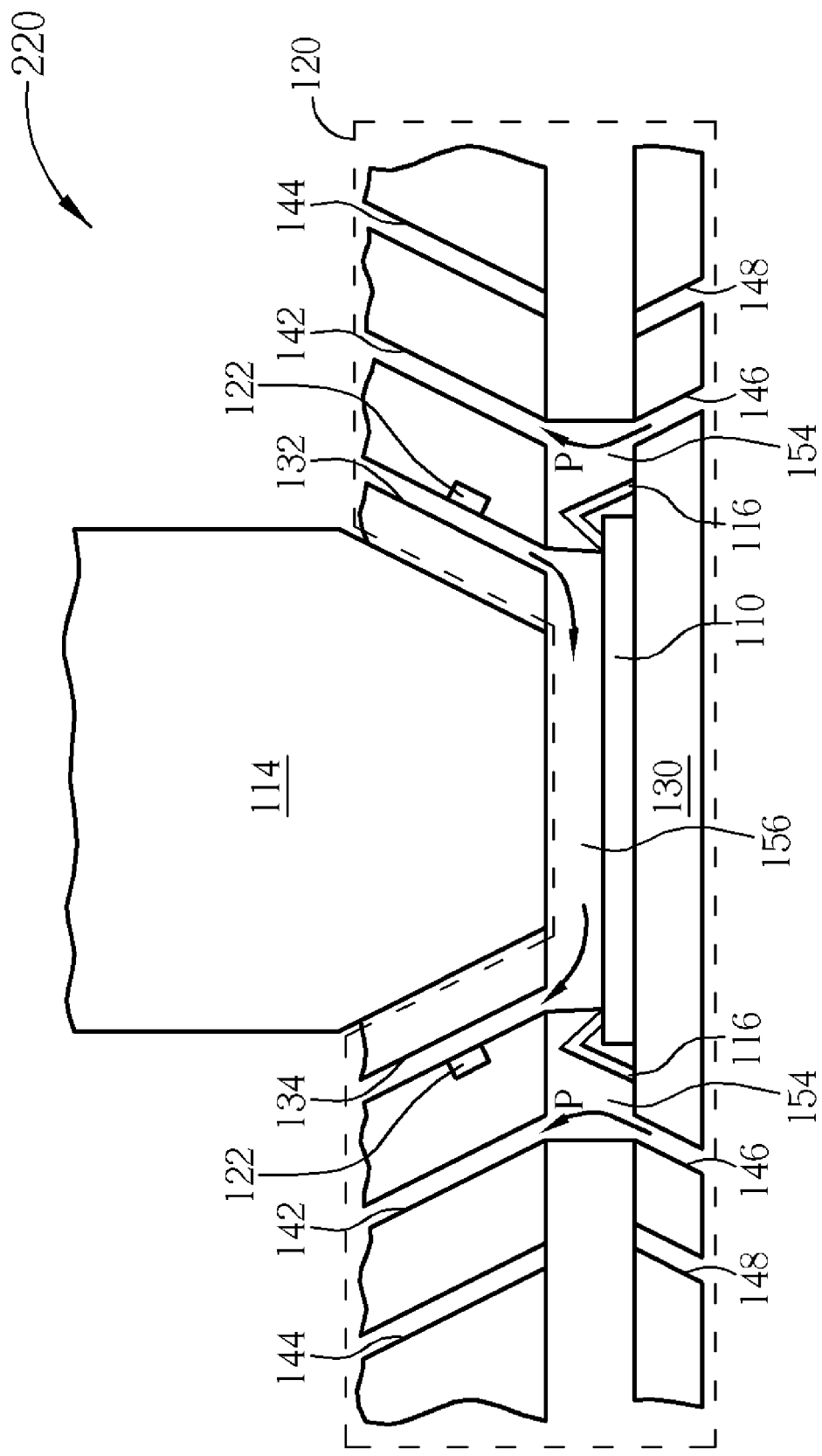
Figure 18:
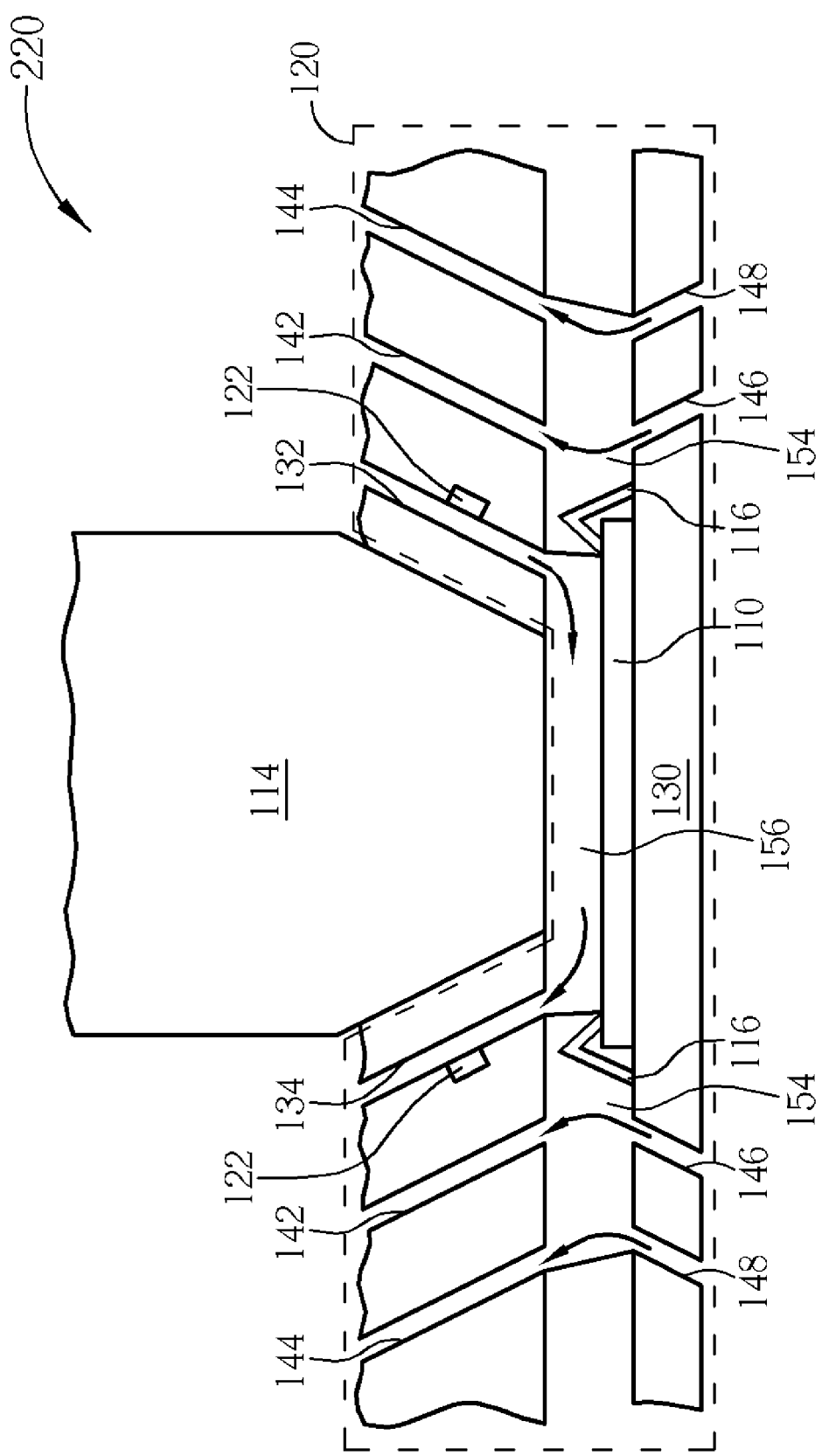

As shown in FIG. 15, the confining fluid 154 still flows from the fourth tube 144, and is recovered by the third tube 142. However, the electrolyte fluid 156 in this operating method flows from the second tube 134, and is recovered by the first the tube 132. As shown in FIG. 16, the flowing path P of the confining fluid 154 is similar to the above-mentioned operating methods, while the electrolyte fluid 156 in this operating method flows from the fifth tube 136, and is recovered by both the first tube 132 and the second tube 134. As shown in FIG. 17, the electrolyte fluid 156 flows from the first the tube 132, and is recovered by the second tube 134. The confining fluid 154 flows from the sixth tube 146, and is recovered by the third tube 142. As shown in FIG. 18, the electrolyte fluid 156 flows from the first the tube 132, and is recovered by the second tube 134. The confining fluid 154 flows from both the sixth tube 146 and the seventh tube 148, and is recovered by both the third tube 142 and the fourth tube 144.

It deserves to be mentioned that the above-mentioned fluid-confining apparatus 220, the flowing path P of the confining fluid 154, and the flowing path of the electrolyte fluid 156 can be applied to the solvent cleaning process. The fluid-confining apparatus 220 of the present invention can be applied to any process that utilizes fluid, such as a drying process, a wet etching process, an electroless plating process, a chemical mechanical polishing (CMP) process, or an electro chemical mechanical polishing process. When the fluid-confining apparatus 220 is applied to the cleaning process, it is not necessary for the anode electrode 124 and the cathode electrode 116 to be electrically connected to the different voltages, and the electrolyte fluid 156 is replaced by a cleaning fluid, such as a deionized water (DI water) or a supercritical fluid. Therefore, after a semiconductor substrate 110 undergoes an electro chemical plating process in the fluid-confining apparatus 220, the voltages applied the anode electrode and to the cathode electrode can be turned off, and the process fluid can be changed, so that the semiconductor substrate 110 can undergo a cleaning process or a drying process in the same apparatus.

Figure 19:
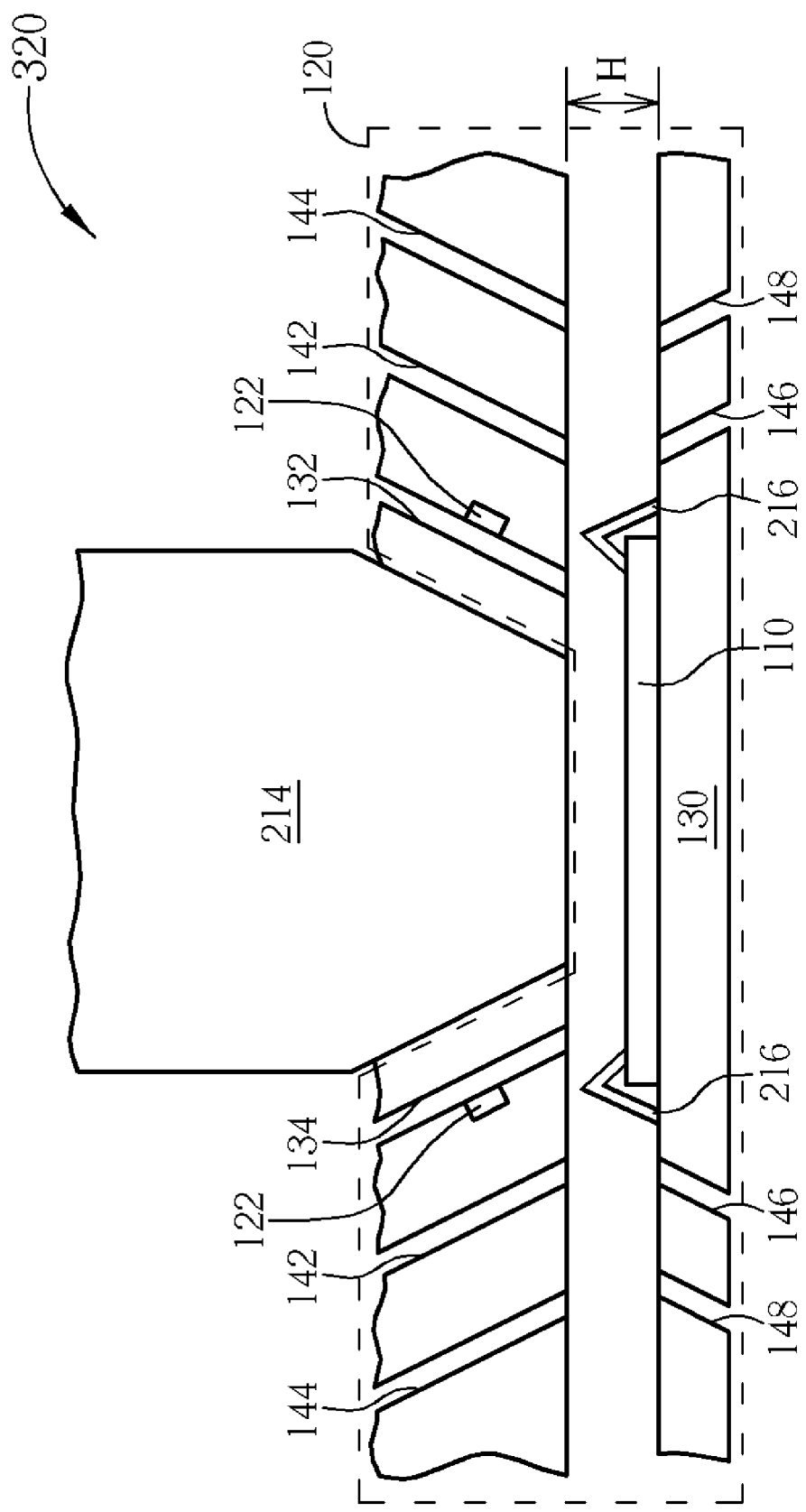
FIG. 19 and FIG. 20 are schematic cross-sectional diagrams illustrating a fluid-confining apparatus according to a second preferred embodiment of the present invention.

It is worthy of note that the anode electrode and the cathode electrode of the fluid-confining apparatus are unnecessary in a cleaning process. Please refer to FIG. 19, which is a schematic cross-sectional diagram illustrating a fluid-confining apparatus 320 applied for cleaning according to a second preferred embodiment of the present invention, where like number numerals designate similar or the same parts, regions or elements. As shown in FIG. 19, a fluid-confining apparatus 320 applied for cleaning is provided in this embodiment. The main difference between the fluid-confining apparatus 320 and the fluid-confining apparatus 220 is that the fluid-confining apparatus 320 applied for cleaning has no cathode electrode 116 and no anode system 114. Therefore, the fluid-confining apparatus 320 includes a fixing component 216 for fixing the semiconductor substrate 110, and includes a tube system 214 to control the reaction height H of the process. The fixing component 216 can be an electrostatic chuck, a vacuum chuck or a clamp type structure. The tube system 214 is disposed above the substrate holder 130, and is substantially corresponding to the semiconductor substrate 110. The tube system 214 and the substrate holder 130 are a reaction height H apart. A treatment region (not shown in the drawing) and a non-treatment region (not shown in the drawing) are defined on the substrate holder 130. A portion of the semiconductor substrate 110, which will be disposed in the treatment region, will undergo the plating process, and a portion of the semiconductor substrate 110, which will be disposed in the non-treatment region, will not undergo the plating process.

Figure 20:
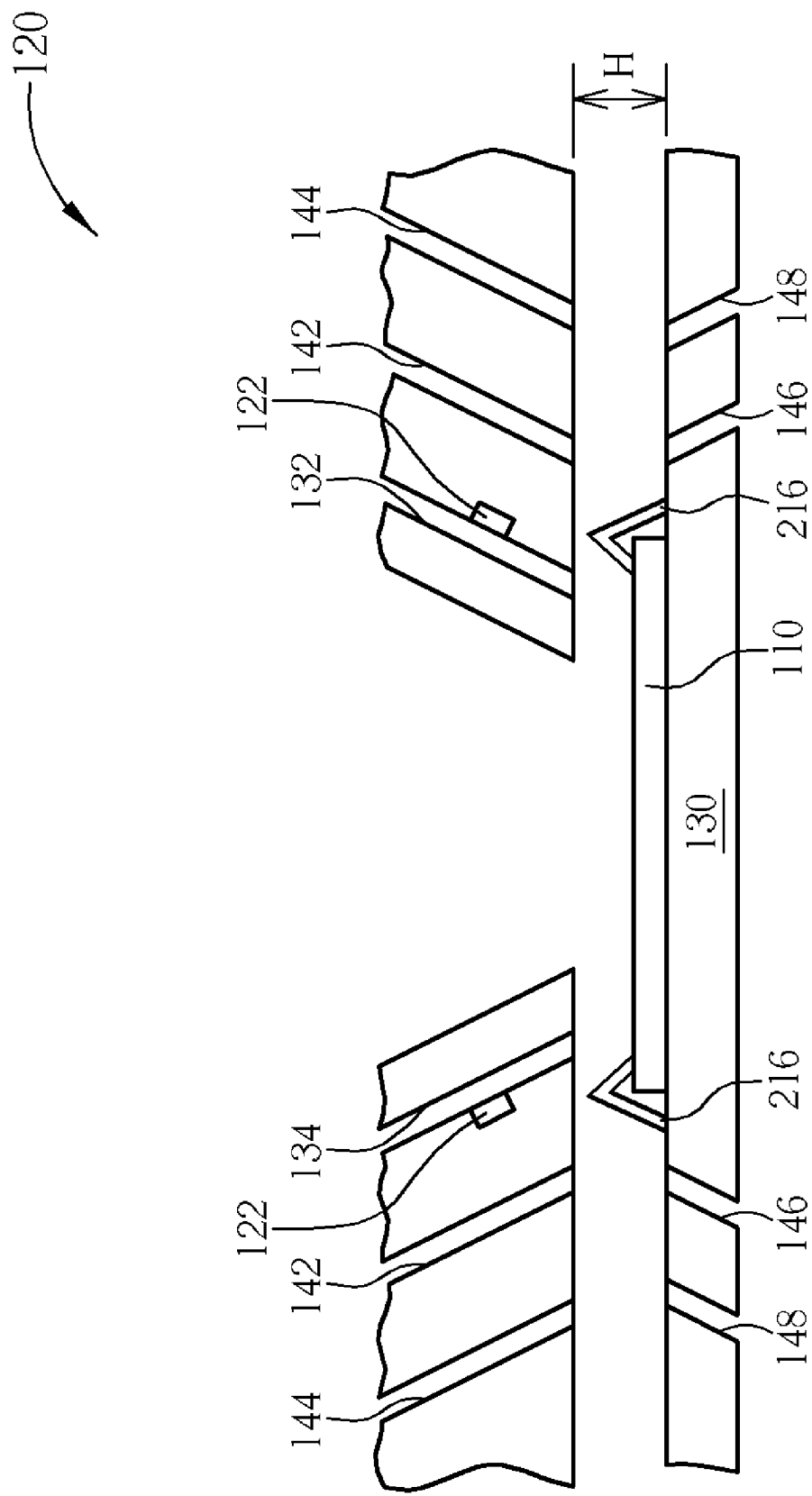

In other embodiments of the present invention, the fluid-confining system 120 itself can perform a cleaning process, an etching process or a drying process. The position of the process fluid can be controlled by the gravity of the process fluid and the confining fluid, as shown in FIG. 20.

Figure 21:
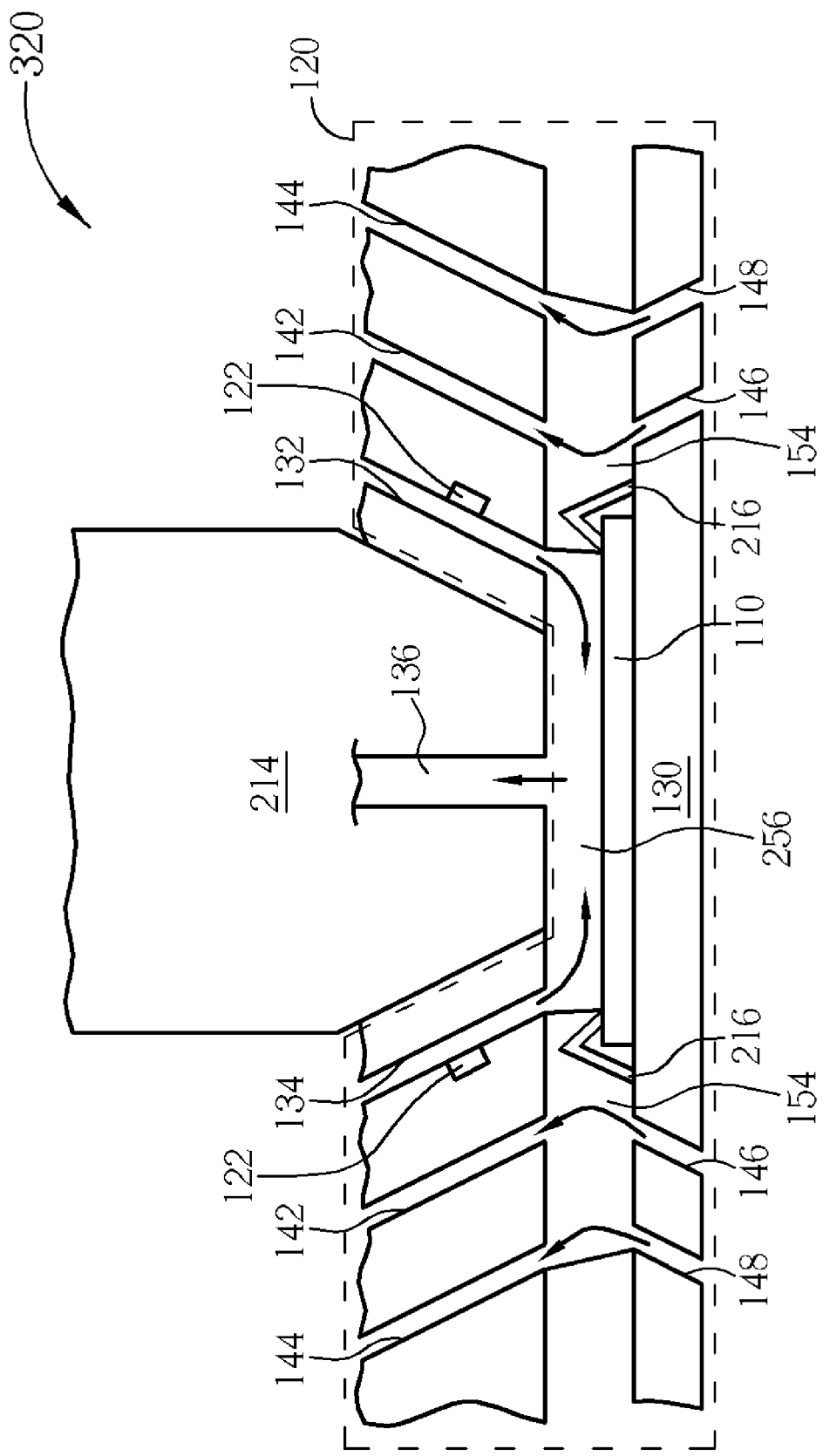
FIG. 21 through FIG. 24 are schematic diagrams illustrating other operating methods of the fluid-confining apparatus shown in FIG. 19.
Figure 22:
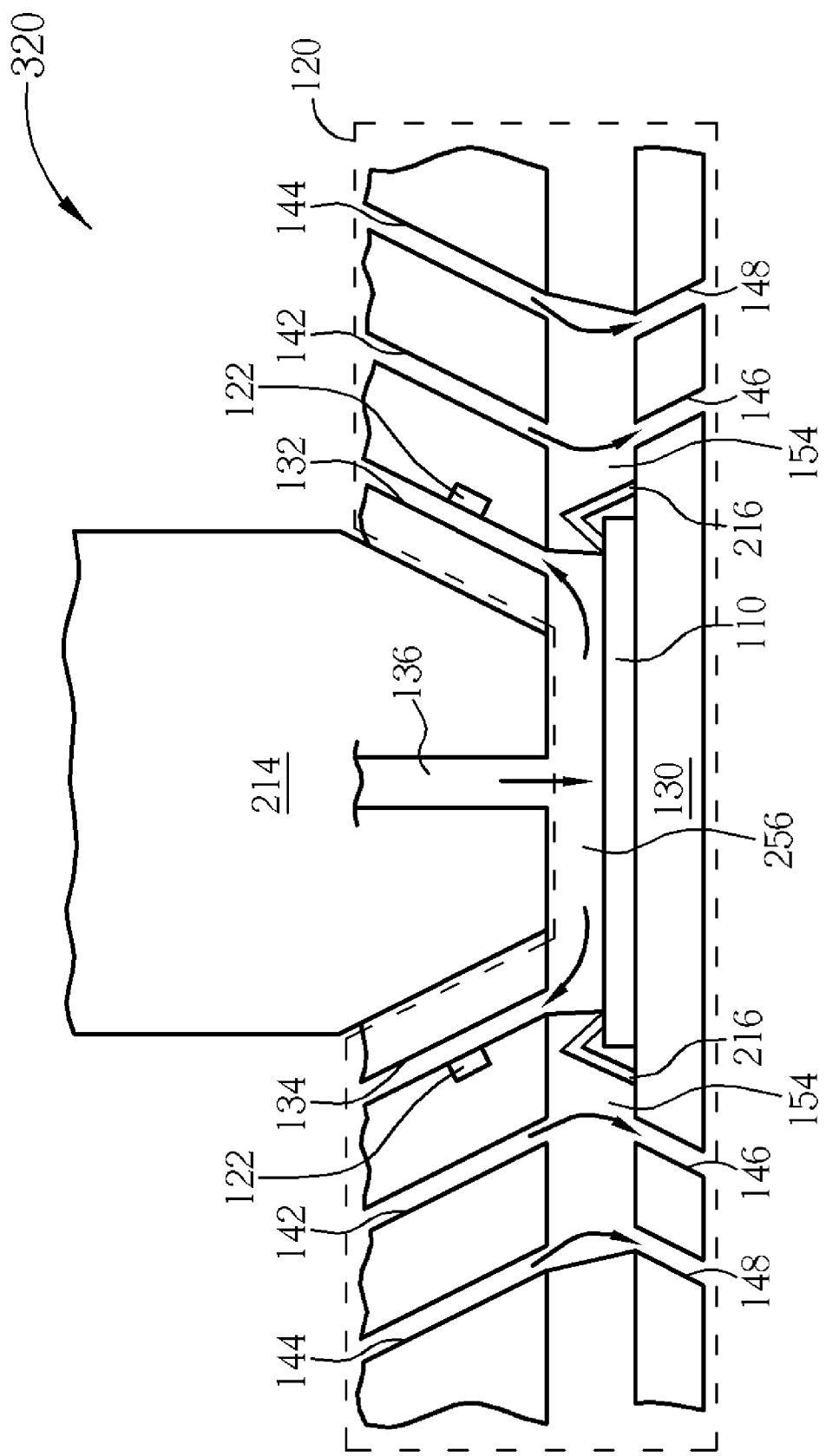

When the fluid-confining apparatus 320 is applied to an etching process or a cleaning process, the flowing paths of the confining fluid and the process fluid can be different from the above-mentioned flowing paths. Please refer to FIG. 21 to FIG. 24, which are schematic diagrams illustrating other operating methods of the fluid-confining apparatus 320 applied for cleaning shown in FIG. 19, where like number numerals designate similar or the same parts, regions or elements, and the semiconductor substrate 110 can still be a wafer. As shown in FIG. 21, when the front side of the semiconductor substrate 110 should be cleaned, the cleaning fluid 256 flows from both the first the tube 132 and the second tube 134 and is recovered by the fifth tube 136. The confining fluid 154 is supplied from both the sixth tube 146 and the seventh tube 148, flows from bottom to top, and is recovered by the third tube 142 and the fourth tube 144. Otherwise, as shown in FIG. 22, the confining fluid 154 can be supplied from both the third tube 142 and the fourth tube 144, flows from top to bottom, and is recovered by the sixth tube 146 and the seventh tube 148.

Figure 23:
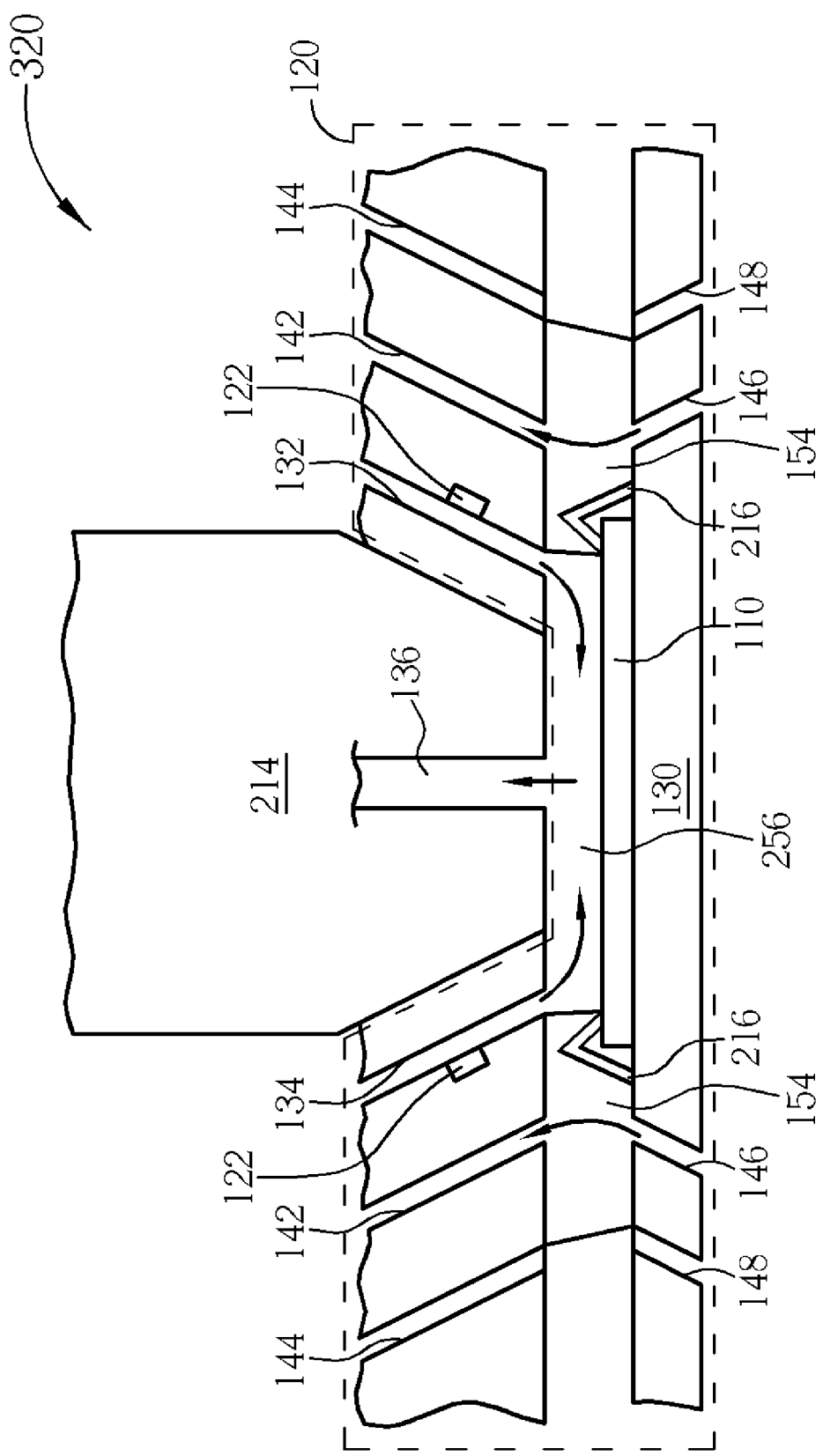
Figure 24:
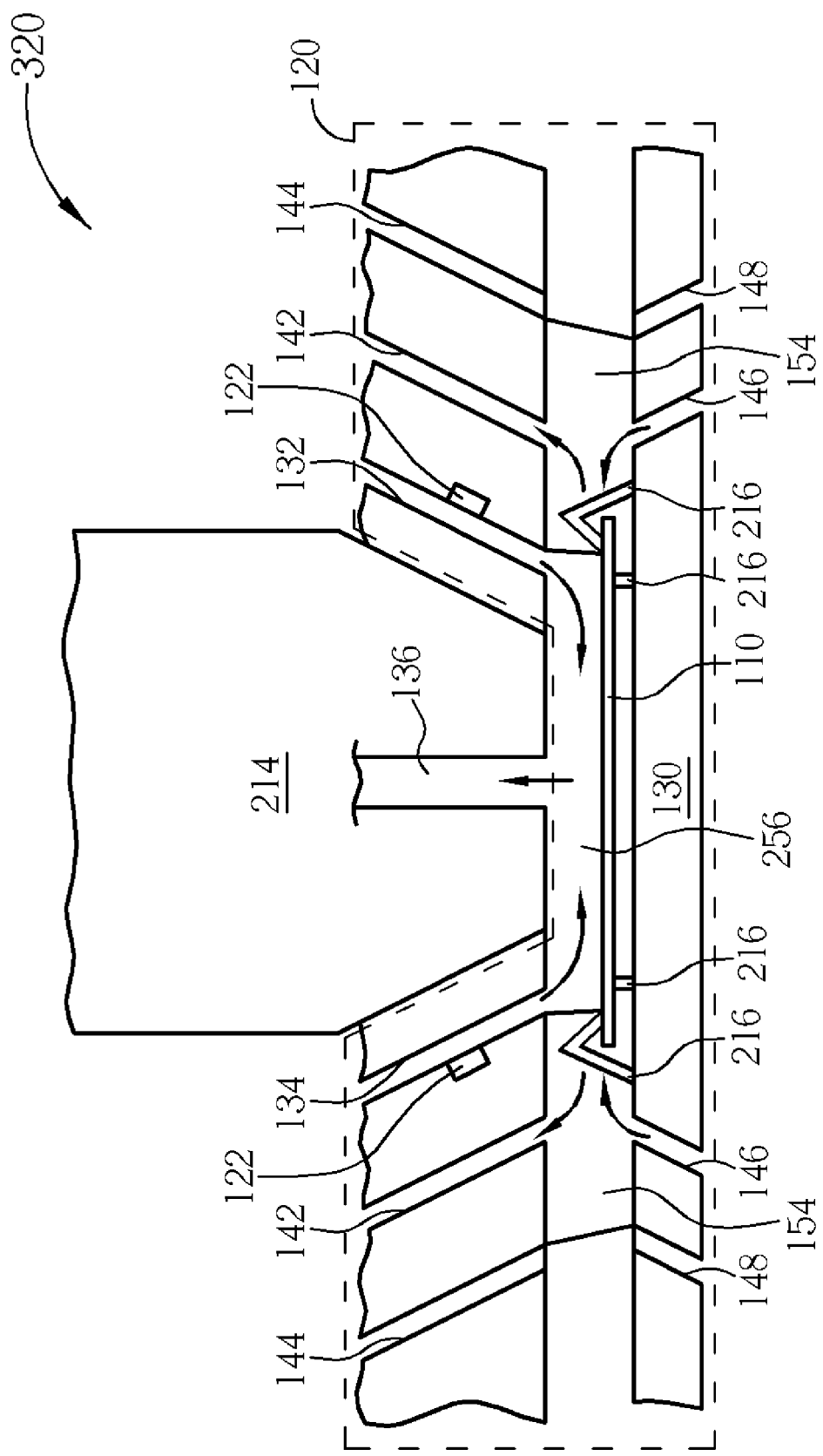

When the edge bevel of the semiconductor substrate 110 should be cleaned, the treatment region of the fluid-confining apparatus 320 corresponds to the edge bevel of the semiconductor substrate 110, and the non-treatment region of the fluid-confining apparatus 320 corresponds to the front side of the semiconductor substrate 110. As shown in FIG. 23, the confining fluid 154 flows from both the first the tube 132 and the second tube 134 and is recovered by the fifth tube 136 so to prevent the front side of the semiconductor substrate 110 from the cleaning fluid 256. The cleaning fluid 256 flows from the sixth tube 146, and is recovered by the third tube 142. Furthermore, as shown in FIG. 24, when the back surface of the semiconductor substrate 110 should be cleaned, the semiconductor substrate 110 is slightly lifted by the fixing component 216. Afterward, the cleaning fluid 256 flows from the sixth tube 146, and is recovered by the third tube 142. The confining fluid 154 flows from both the first tube 132 and the second tube 134 and is recovered by the fifth tube 136.

Figure 25:
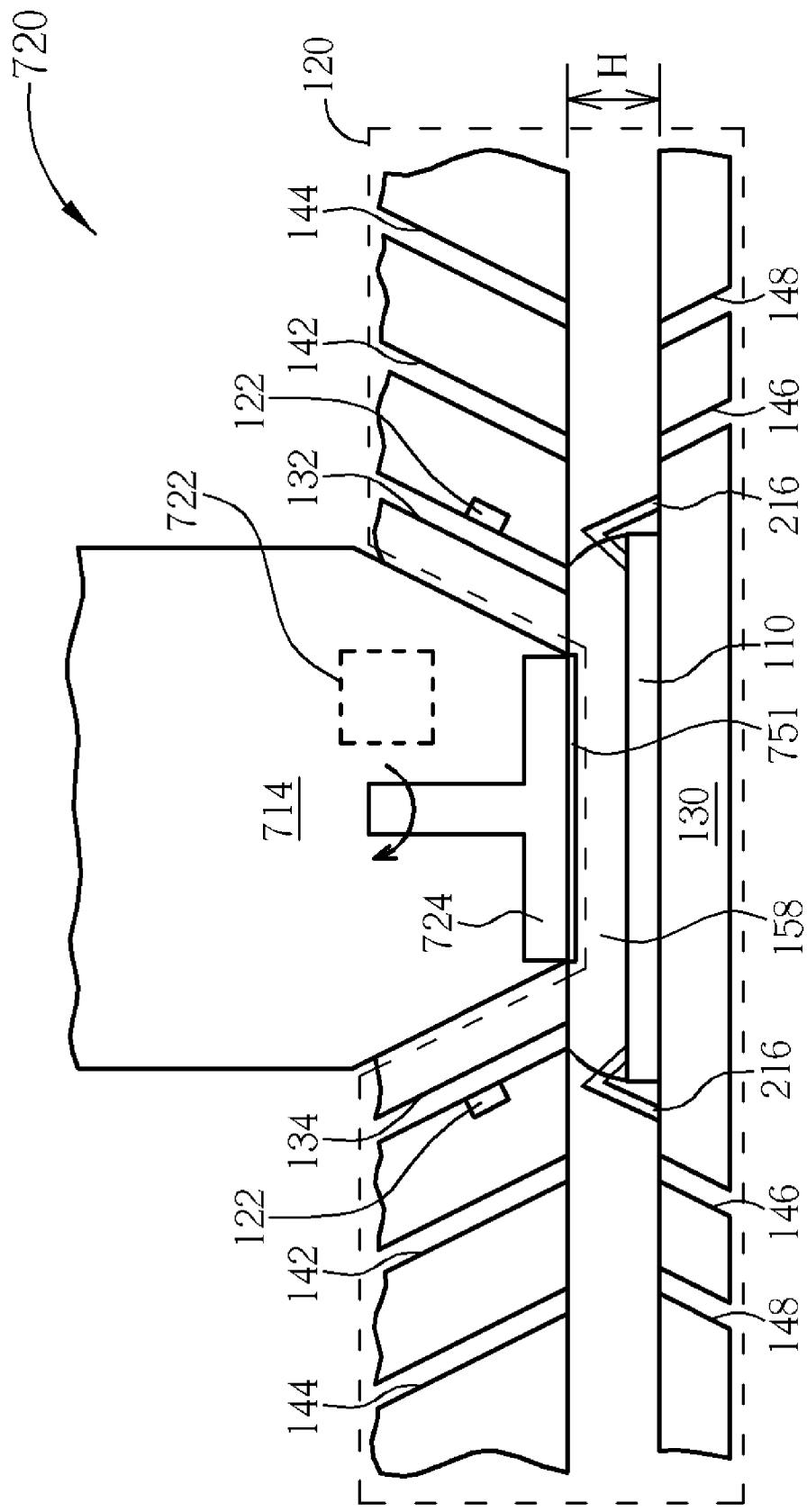
FIG. 25 is a schematic cross-sectional diagram illustrating a fluid-confining apparatus according to a third preferred embodiment of the present invention.

The fluid-confining apparatus 220 and the fluid-confining apparatus 320 can further be applied to the chemical mechanical polishing process, which includes the traditional chemical mechanical polishing process and the electrochemical polishing process. Please refer to FIG. 25, which is a schematic cross-sectional diagram illustrating a fluid-confining apparatus 720 according to a third preferred embodiment of the present invention. As shown in FIG. 25, a fluid-confining apparatus 720 can include a polishing system 714 and a fluid-confining system 120. The polishing system 714 can include a polishing pad 751, a pad holder 724, and a polishing slurry 158.

When the fluid-confining apparatus 720 is applied to the electrochemical polishing process, the fixing component 216 can be an anode electrode, and the pad holder 724 can be a cathode electrode so to increase the polishing rate by electricity. Furthermore, when the fluid-confining apparatus 720 is applied to the traditional chemical mechanical polishing process, the voltages applied the anode electrode and to the cathode electrode can be turned off, so that the semiconductor substrate 110 can undergo a traditional chemical mechanical polishing process in the same apparatus. In other words, the semiconductor substrate 110 can easily undergo a variety of processes, in the same apparatus by changing the process fluids, some components, or switching components therein. For instance, the semiconductor substrate 110 can undergo a cleaning process in the same apparatus immediately after a chemical mechanical polishing process.

A treatment region (not shown in the drawing) and a non-treatment region (not shown in the drawing) are defined on the substrate holder 130. A portion of the semiconductor substrate 110, which will be disposed in the treatment region, will undergo the chemical mechanical polishing process, and a portion of the semiconductor substrate 110, which will be disposed in the non-treatment region, will not undergo the chemical mechanical polishing process. It deserves to be mentioned that the flowing paths P of the confining fluid 154, and the flowing paths of the process fluid can be applied to the chemical mechanical polishing process. The height and the position of the polishing pad 751 can be adjusted according to the process design. In order to operate a chemical mechanical polishing process in the fluid-confining apparatus 720, the polishing pad 751 can press down on the surface of the semiconductor substrate 110, or the semiconductor substrate 110 can be lifted to the surface of the polishing pad 751 by the substrate holder 130 or the fixing component 216.

The polishing system 714 can further include a sensor 722 for measuring the wafer flatness condition or measuring the thickness of a material layer. An in-situ measurement for the wafer condition can be performed by the sensor 722 during the process, so the process condition can be fed back automatically, and be immediately adjusted. In addition, the polishing system 714 can include various polishing devices, such as a rotary type device, a linear type device, an orbital type device, or a fixed abrasive web system. When a fixed abrasive web system is applied, the fixed abrasive web system employs a roll of polishing pad 751 that contains the polishing abrasive to polish the semiconductor substrate 110 instead of using the polishing slurry. In such a case, the polishing slurry 158 may be diluted water (DI water) or other polishing fluid. The fluid-confining apparatus 720 can do the full wafer polishing, do critical layer polishing, or just do rework flow at local area, such as an outstanding structure of a material layer on the surface of a wafer. In practice, the size of the polishing pad 751 can be larger than, smaller than, or equal to the size of the semiconductor substrate 110.

Accordingly, the fluid-confining apparatus 320 applied for cleaning can also be applied to the traditional chemical mechanical polishing process, when at least a polishing pad is included in the fluid-confining apparatus 320.

Because a confining fluid is applied to confine the polishing slurry 158 or DI water, and the height and the position of the polishing pad 751 can be adjusted to polish a predetermined portion of the semiconductor substrate 110 or the whole semiconductor substrate 110, the fluid-confining apparatus 720 has the following benefits. Firstly, the position of treatment region, the position of non-treatment region and the relative position of the semiconductor substrate 110 can be easily adjusted, so a predetermined portion of the semiconductor substrate 110 can be polished without polishing or damage other portion of the semiconductor substrate 110 or other material layer.

Subsequently, the poor uniformity issue usually exists in the surface of a semiconductor substrate 110 or in the surface of a certain material layer after a traditional etching process, a traditional deposition process, or a traditional polishing process. For example, the edge of a semiconductor substrate 110 is usually thinner than the center of the semiconductor substrate 110 after a traditional polishing process. Since the position of treatment region and the position of non-treatment region can be easily adjusted, and the flatness condition of the semiconductor substrate 110 or of the material layer can be in-situ measured, a semiconductor substrate 110 or a material layer having an optimal uniformity can be automatically formed.

Furthermore, since the position of the treatment region is determined by using a confining fluid, the size of the polishing pad 751 is no longer limited to the traditional size. The fluid-confining apparatus 720 can include a polishing pad 751 having any proper size. In addition, because the polishing slurry 158 or DI water is applied to only the treatment region, the fluid-confining apparatus 720 can prevent portions of the semiconductor substrate 110 positioned within the non-treatment region from contacting the polishing slurry 158 or DI water. As a result, portions of the semiconductor substrate 110 positioned within the non-treatment region are protected from pollution, and consumed quantity of the polishing slurry 158 or DI water is decreased.

Figure 26:
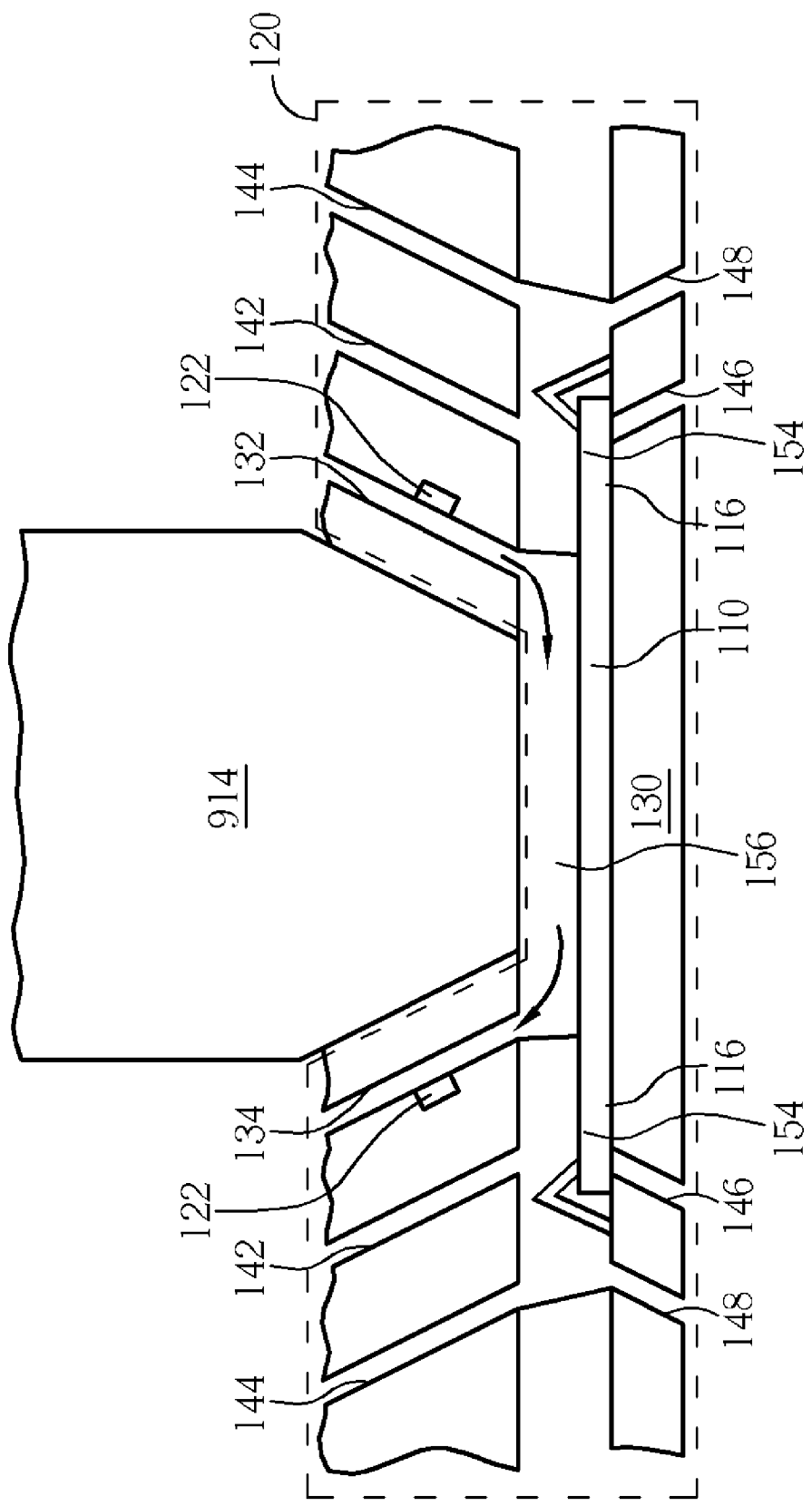
FIG. 26 is a schematic diagram illustrating another operating method of a fluid-confining apparatus.

It should be noted that all the fluid-confining apparatus 220 applied for plating, the fluid-confining apparatus 320 applied for cleaning, and the fluid-confining apparatus 720 applied for polishing can perform a local process on a particular region of a wafer. Please refer to FIG. 26, which is a schematic diagram illustrating another operating method of a fluid-confining apparatus. As shown in FIG. 26, a fluid-confining apparatus can includes a fluid-confining system 120 and a system 914, where the system 914 can be the anode system 114, the tube system 214, or the polishing system 714. The fluid-confining apparatus can perform a local plating process, a local cleaning process or a local polishing process on the semiconductor substrate 110. The treatment region should not be limited to the front side or the edge bevel of the wafer. The treatment region can correspond to any portion of the semiconductor substrate 110, such as a certain active region of a wafer, while the other portions of the semiconductor substrate 110, such as a peripheral region of the wafer, correspond to the non-treatment region. In other embodiments, the treatment region can correspond to a front side, a backside, an edge bevel, or any local area of the wafer, while the other portions of the wafer correspond to the non-treatment region.

In sum, because a confining fluid is applied to confine the process fluid, the present invention needs no electrolytic tank, and saves a great deal of the electrolyte fluid. In addition, both the confining fluid and the process fluid can circulate and be reused in the present invention. After the confining fluid or the process fluid is recovered by the tubes, the confining fluid or the process fluid can directly reflow into the fluid-confining apparatus through another tube. Otherwise, the recovered confining fluid or the recovered process fluid can undergo an in-situ treatment or an ex-situ treatment, and then reflow into the fluid-confining apparatus to help the process. In other words, the recovered confining fluid or the recovered process fluid can be adjusted according to the condition and the composition of the recovered confining fluid or the recovered process fluid. For example, a different fluid or a fresh solution can be added into the recovered confining fluid or the recovered process fluid. Otherwise, an appropriate separation might be performed on the recovered confining fluid or the recovered process fluid, and then the treated confining fluid or the treated process fluid can reflow into the fluid-confining apparatus. Thus, the condition and the composition of the process fluid are adjusted easily and immediately so to maintain a great operation for the process. A long time and a huge cost for exchanging the process fluid are therefore saved, and a consumption of the process fluid is reduced.

In addition, a heating device can be provided in the fluid-confining apparatus according to the process design. The heating device can heat the semiconductor substrate or the process fluid so that the reaction temperature of the process is increased or that that reaction is speeded.

On the other hand, merely a predetermined portion of the semiconductor substrate will undergo the process by controlling the tube and the flow rate, and there is no metal layer deposited on the edge bevel in the electro chemical plating process. Therefore, the edge bevel removal step (EBR step) can be saved. Accordingly, the process time and the process cost are also saved, and the complexity of the process is simplified.

Figure 27:
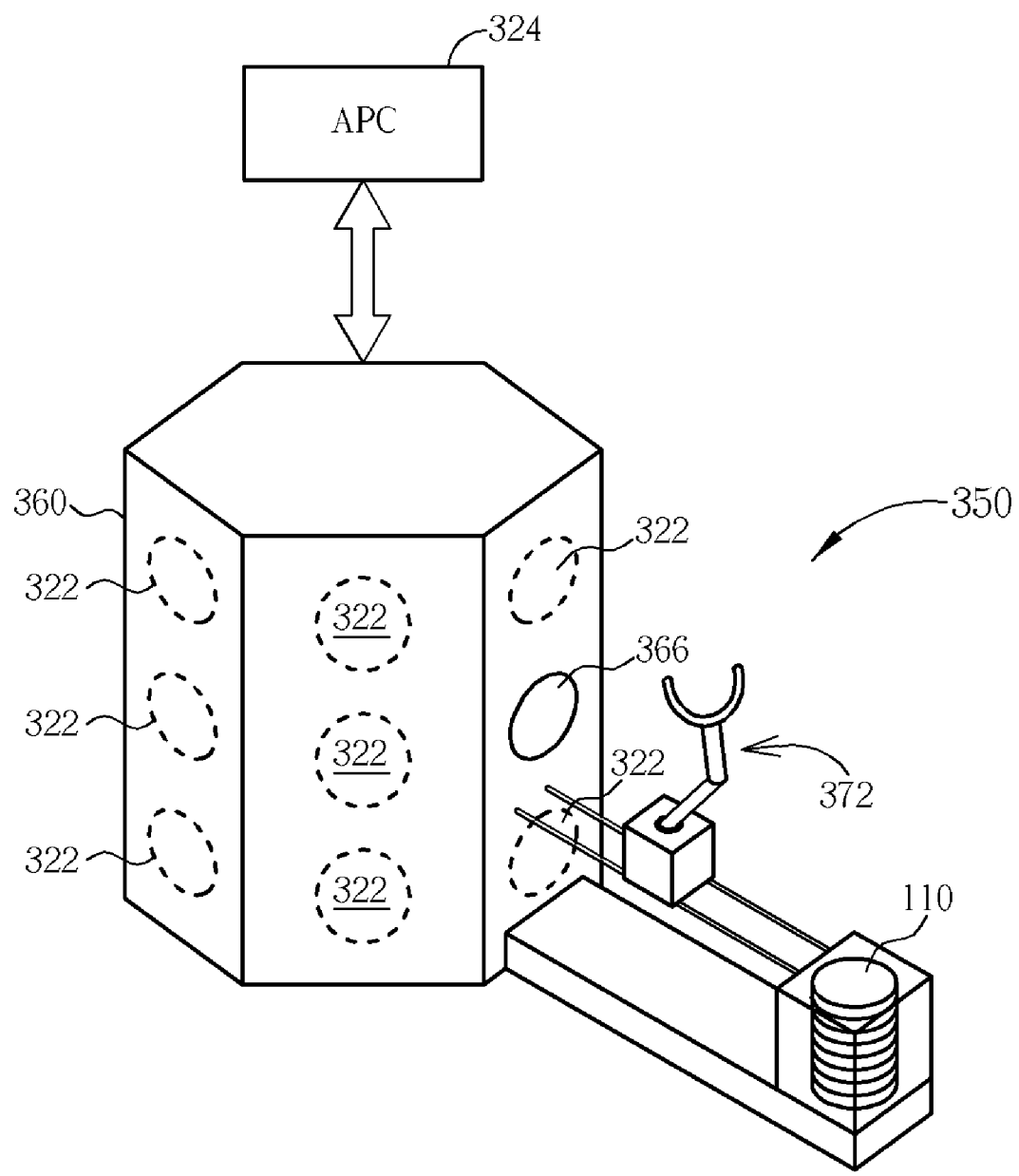
FIG. 27 is a schematic diagram illustrating a process equipment according to a fourth preferred embodiment of the present invention.
Figure 28:
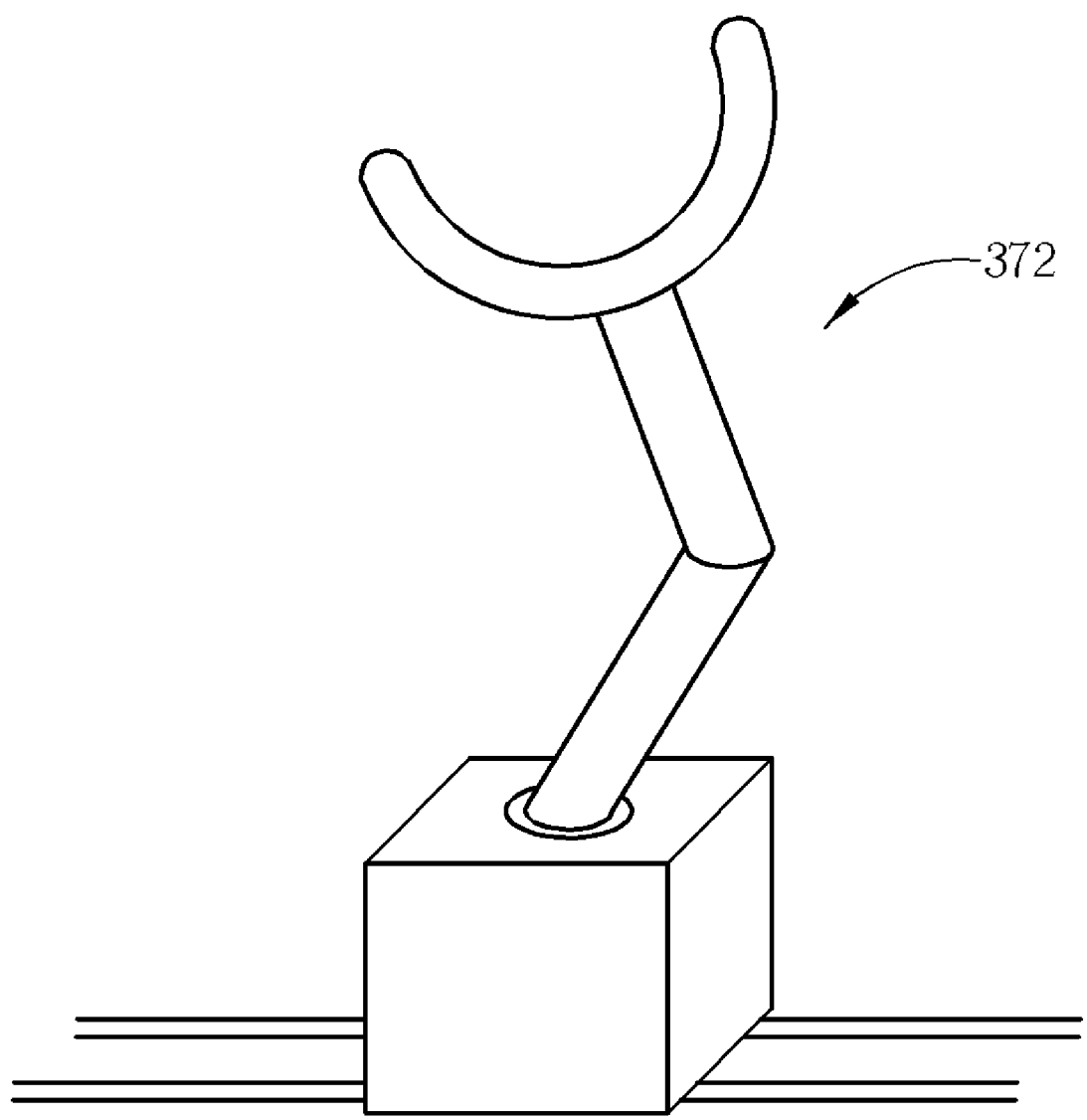
FIG. 28 is a schematic three-dimensional diagram illustrating the transferring device shown in FIG. 27.
Figure 29:
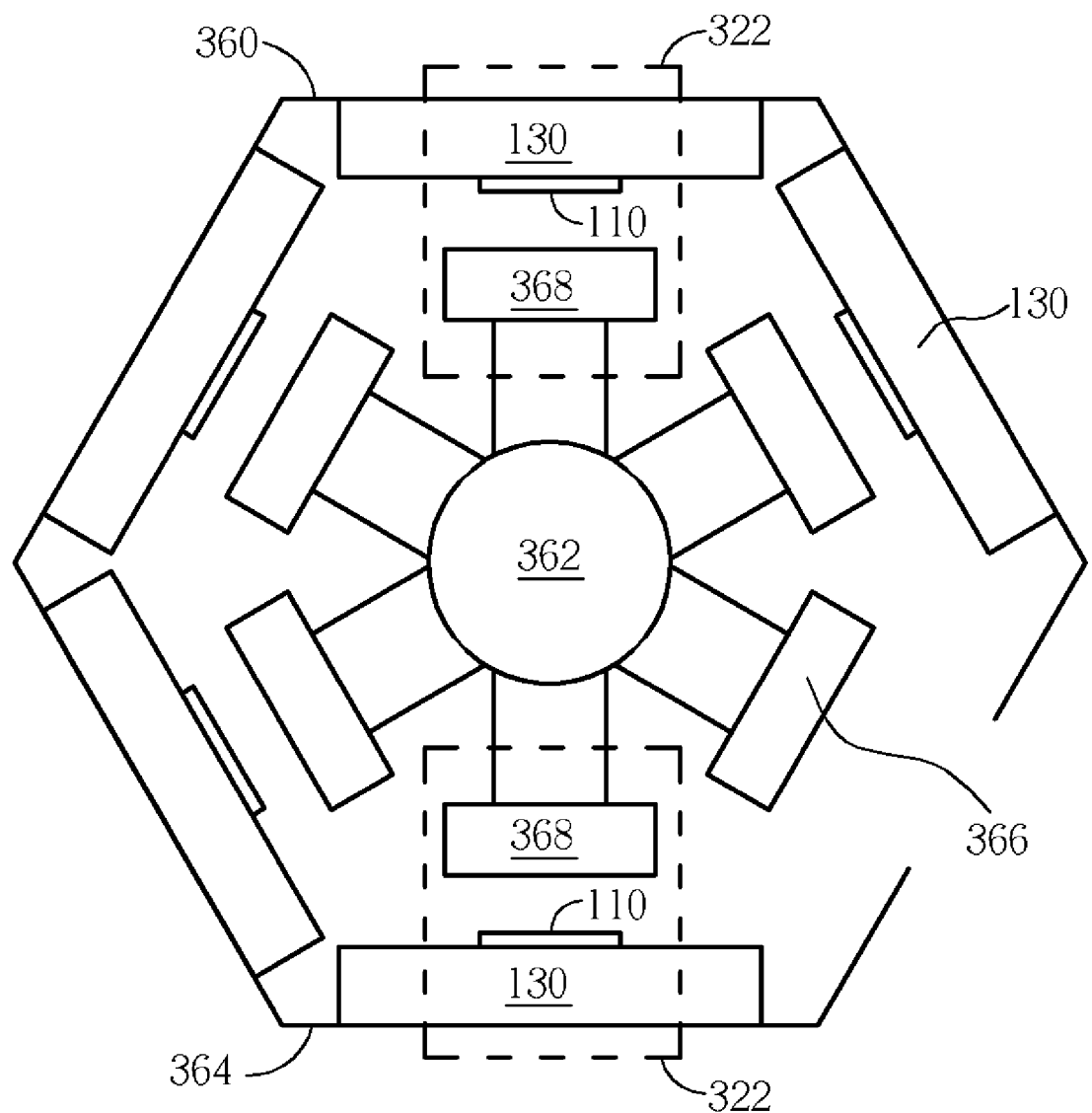
FIG. 29 is a schematic cross-sectional diagram illustrating the process equipment shown in FIG. 27.

Because a confining fluid is applied to confine the process fluid in place of the prior art electrolytic tank, the process equipments are no longer limited to the traditional equipment. Please refer to FIG. 27 to FIG. 29. FIG. 27 is a schematic diagram illustrating a process equipment 350 according to a fourth preferred embodiment of the present invention, FIG. 28 is a schematic three-dimensional diagram illustrating the transferring device 372 shown in FIG. 27, and FIG. 29 is a schematic cross-sectional diagram illustrating the middle level of the process equipment 350 shown in FIG. 27, where like number numerals designate similar or the same parts, regions or elements. As shown in FIG. 27 to FIG. 29, the process equipment 350 includes a column-shaped platform 360, an automatic process control system (APC system) 324, a plurality of fluid-confining apparatuses 322, at least a loading/unloading device 366, and at least a transferring device 372. The column-shaped platform 360 can be a vertical platform. The process equipment 350 includes an upper level, a middle level and a lower level, and each level can connect to six process devices or process apparatuses. In this embodiment, one of the process apparatuses at the middle level can be the said loading/unloading device 366, while the other process apparatuses can include the fluid-confining apparatuses 322 or other reaction chamber. The APC system 324 is capable of real-time detecting the performances of the process so as to real-time regulate the settings of process parameters in the process equipment 350.

The fluid-confining apparatus 322 can have a structure similar to the fluid-confining apparatus 220, the fluid-confining apparatus 320 or the fluid-confining apparatus 720, and is disposed on at least a sidewall of the column-shaped platform 360. The fluid-confining apparatus 322 can be applied to any possible semiconductor process, such as an electro chemical plating process, a cleaning process, or a chemical mechanical polishing process. In other words, each fluid-confining apparatus 322 can include a substrate holder 130 and a process system 368. When the fluid-confining apparatus 322 is applied to an electro chemical plating process, the process system 368 can be the anode system 114; When the fluid-confining apparatus 322 is applied to a cleaning process, the process system 368 can be the tube system 214; and when the fluid-confining apparatus 322 is applied to a CMP process, the process system 368 can be the polishing system 714.

As shown in FIG. 29, the column-shaped platform 360 includes a cylindrical brace 362 and a shell 364 having a prism structure. In this embodiment, the shell 364 is a hexagonal columnar structure that has six column sides. The cylindrical brace 362 can connect to five process systems 368 and a loading/unloading device 366 at the middle level, and each process system 368 or the loading/unloading device 366 corresponds to a column side of the shell 364. In other embodiments of the present invention, the column-shaped platform 360 can include a brace having various shapes, or a shell having various shapes. For example, the column-shaped platform 360 might include any prism brace, a helical brace, or a cylindrical shell.

The transferring device 372 is disposed around the column-shaped platform 360 so as to transfer a plurality of semiconductor substrates 110 in to the loading/unloading device 366 individually. In order to handle the semiconductor substrates 110, a robot arm 374 of the transferring device 372 moves to the location of the untreated semiconductor substrates 110, and picks one semiconductor substrate 110. Subsequently, the semiconductor substrate 110 is moved toward the loading/unloading device 366, and is rotated parallel with the loading/unloading device 366. Afterward, the semiconductor substrate 110 is put onto the platform of the loading/unloading device 366. The loading/unloading device 366 is disposed parallel with the sidewalls of the column-shaped platform 360, and are applied for loading and/or unloading the semiconductor substrate 110 into/from the column-shaped platform 360. The loading/unloading device 366 can include a vacuum sucker for holding the semiconductor substrate 110. The robot arm 374 is preferred a robot arm having a multiple blades. The joints of the robot arm can move or rotate in any direction so that the gripper head of the robot arm 374 can move free in three dimensions.

After a single semiconductor substrate 110 is put onto the loading/unloading device 366, the column-shaped platform 360 can be rotated horizontally and/or moved vertically so that the said semiconductor substrate 110 is disposed on one substrate holder 130 of the fluid-confining apparatus 322. The loading/unloading device 366 is substantially moved toward its original position, and faces the transferring device 372. At this time, the transferring device 372 can repeat the transferring step so the semiconductor substrates 110 are transferred one by one until each substrate holder 130 at each level of the process equipment 350 has a semiconductor substrate 110.

Next, an electro chemical plating process, a front side/back side/edge bevel cleaning process, a CMP process, and/or an electro chemical mechanical polishing process can be performed on each of the semiconductor substrates 110 in the meantime by one of the above-mentioned operating methods. Thereafter, the cylindrical brace 362 can be rotated horizontally and/or moved vertically so that each of the semiconductor substrates 110 can be unloaded from the column-shaped platform 360. Afterward, the cylindrical brace 362 can move again to load the untreated semiconductor substrates 110.

In other embodiments of the present invention, the position of the loading/unloading device 366, the positions of the fluid-confining apparatuses 322, and the performing processes in the fluid-confining apparatuses 322 are adjustable, and can be exchanged. In addition, the process equipment 350 can include other process devices, such as a drying device.

Because the process fluid is confined by a confining fluid, the process fluid is no longer placed in a tank. As a result, the fluid-confining apparatus 322 and the semiconductor substrate 110 not only can be arranged horizontally, but also can be arranged vertically. Therefore, the process equipment 350 can be designed as a vertical equipment, and the loading device and the unloading device can be integrated into the process equipment 350, so the occupied area of the process equipment 350 is effectively saved. In addition, a plurality of semiconductor substrates 110 can be handled in batch by the process equipment 350, so the output of the process is significantly improved.

Figure 30:
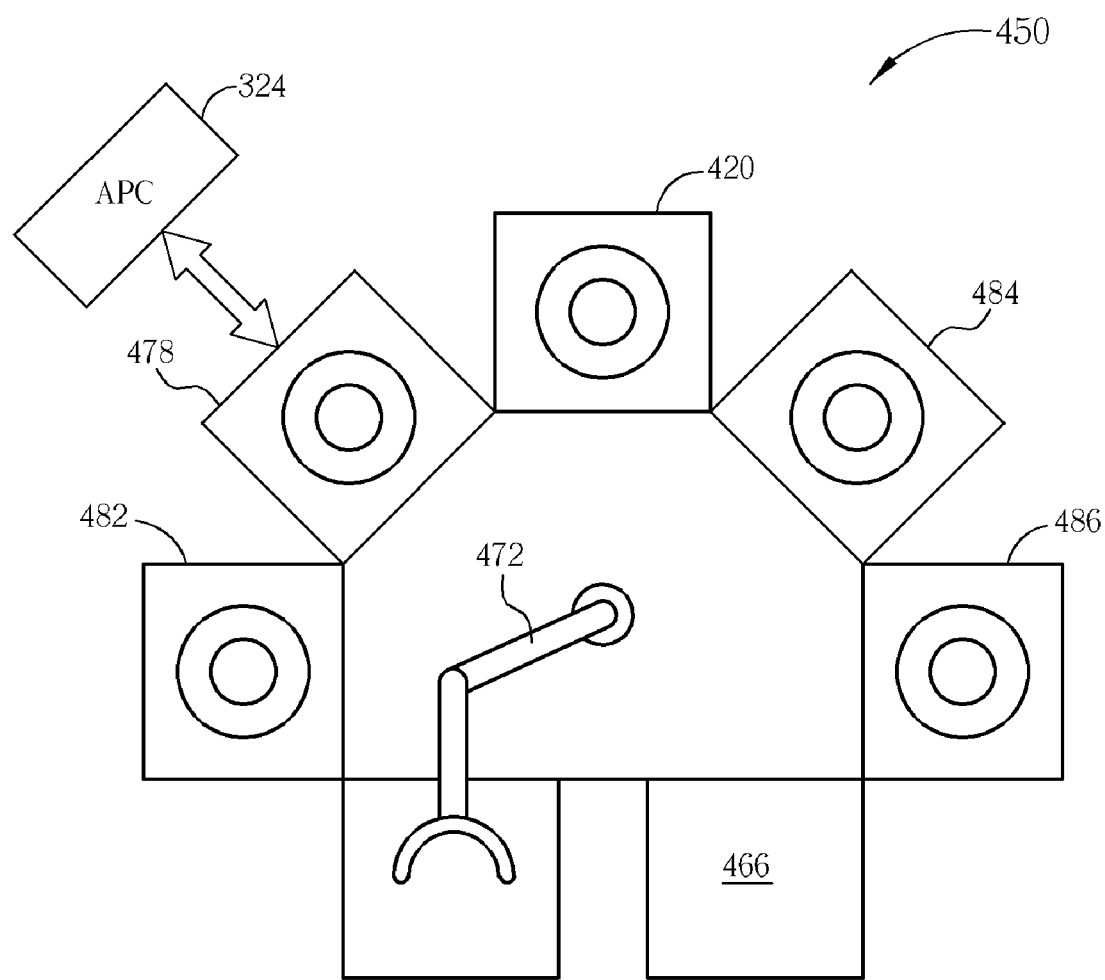
FIG. 30 is a schematic diagram illustrating a process equipment according to a fifth preferred embodiment of the present invention.

Furthermore, the fluid-confining apparatus and various reaction apparatuses can be integrated into a single process equipment in the present invention. Please refer to FIG. 30, which is a schematic diagram illustrating a process equipment 450 according to a fifth preferred embodiment of the present invention, where like number numerals designate similar or the same parts, regions or elements. As shown in FIG. 30, the process equipment 450 includes an APC system 324, a loading device 466, at least a fluid-confining apparatus 420, at least a transferring device 472, at least a seed layer deposition chamber 478, at least a barrier layer deposition chamber 482, at least a drying chamber 484 and at least a chamber 486 for pre-deposition, such as a solvent cleaning chamber or a plasma cleaning.

In this embodiment, the transferring device 472 can be a robot arm. After the semiconductor substrate 110 is loaded into the loading device 466 of the process equipment 450, the semiconductor substrate 110 can be transferred among the loading device 466, the fluid-confining apparatus 420, the seed layer deposition chamber 478, the barrier layer deposition chamber 482, the drying chamber 484 and the pre-deposition chamber 486 through the transferring device 472. The loading device 466 in this embodiment can also function as an unloading device. In other embodiments, the process equipment 450 can further include an unloading device.

The fluid-confining apparatus 420 can have a structure similar to the fluid-confining apparatus 220, the fluid-confining apparatus 320 or the fluid-confining apparatus 720, and is applied to any possible semiconductor process, such as an electro chemical plating process, a cleaning process, or a chemical mechanical polishing process. The seed layer deposition chamber 478 can be applied for performing a seed layer deposition process on the semiconductor substrate 110. The barrier layer deposition chamber 482 can be applied for performing a barrier layer deposition process on the semiconductor substrate 110. The drying chamber 484 can be applied for performing a drying process on the semiconductor substrate 110, and the pre-deposition chamber 486 can be applied for performing a pre-deposition process on the semiconductor substrate 110.

It should be noted that the seed layer deposition chamber 478, the barrier layer deposition chamber 482, the drying chamber 484 and the pre-deposition chamber 486 are actually not necessary in this embodiment. In this embodiment, the fluid-confining apparatus 420 of the present invention need not contain a huge electrolytic tank, the semiconductor substrate 110 need not be fixed by both the cathode electrode and the fixing component in advance, and the process need not be performed in a vacuum. As a result, the fluid-confining apparatus 420 can be easily integrated with various reaction apparatuses in one process equipment 450. Therefore, it should be understood by a person skilled in this art that the seed layer deposition chamber 478, the barrier layer deposition chamber 482, the drying chamber 484 and the pre-deposition chamber 486 in this embodiment are actually can be replaced by other process chambers, such as a post-deposition chamber, grinding process chamber, sputtering process chamber, any chemical vapor deposition chamber or any physical vapor deposition chamber.

Figure 31:
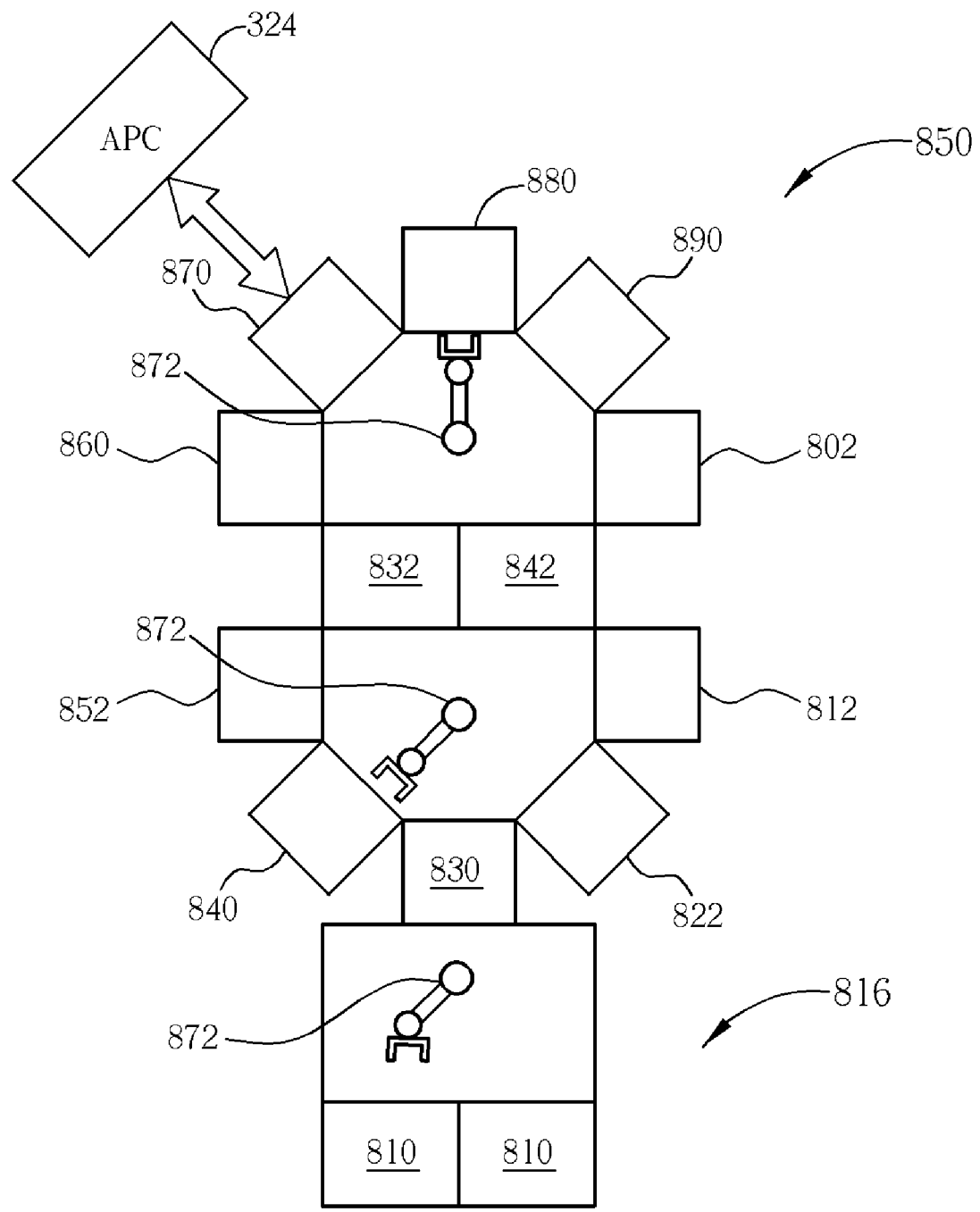
FIG. 31 is a schematic diagram illustrating a process equipment according to a sixth preferred embodiment of the present invention.

Please refer to FIG. 31, which is a schematic diagram illustrating a process equipment 850 according to a sixth preferred embodiment of the present invention, where like number numerals designate similar or the same parts, regions or elements. As shown in FIG. 31, the process equipment 850 is an all-in-one system, including a load part 816, a single wafer load lock chamber (SWLL chamber) 830, two pre-cleaning chambers 840, 822, at least a tantalum/tantalum nitride (Ta/TaN) deposition chamber 852, at least a copper (Cu) seed layer deposition chamber 812, two buffer chambers 832, 842, two Cu ECP chambers 860, 802, two Cu CMP chambers 870, 890, at least a cap layer forming chamber 880, and three robot arms 872. All processes for fabricating chips can be performed in this system in vacuum.

The load port 816, as an entrance and an exit of the process equipment 850, is used for loading a plurality of pods containing wafers for processing. The load port 816 can include at least a wafer interface 810. The wafer interface 810 may be a standardized mechanical interface (SMIF) for loading a plurality of standardized SMIF pods for adapting to the technique of mini-environment. Otherwise, the wafer interface 810 of the load port 816 may be provided to accommodate to the front opening unified pod (FOUP). It should be noted that the process equipment 850 can include a plurality of load ports 816, and a load port 816 can include a plurality of wafer interfaces 810. These load ports 816 or wafer interfaces 810 can be disposed at any possible position in the process equipment 850 in practice.

The single wafer load lock chamber 830 can include an orientor to orient a wafer by its orientation or notch. Otherwise, the single wafer load lock chamber 830 can perform processes, such as a degas step, a cooling step, a pumping step, or a purge step, on the semiconductor substrate 110. The pre-cleaning chamber 840 and the pre-cleaning chamber 822 can be applied for performing a pre-cleaning process on the semiconductor substrate 110 before a deposition process. The Ta/TaN deposition chamber 852 can be applied for depositing a Ta layer and/or a TaN layer on the semiconductor substrate 110. The Ta layer or the TaN layer can function as a barrier layer between a dielectric layer and a copper layer. The Cu seed layer deposition chamber 812 can be applied for depositing a Cu seed layer on the surface of the semiconductor substrate 110. The buffer chamber 832 and the buffer chamber 842 can be applied for performing perform processes, such as a degas step, a cooling step, a pumping step, a purge step, a anneal step, or a metrology step, on the semiconductor substrate 110.

The Cu ECP chamber 860 and the Cu ECP chamber 802 can have a structure similar to the fluid-confining apparatus 120, and is applied for performing an electro chemical plating process on the semiconductor substrate 110 so that a Cu layer is formed on the surface of the above-mentioned Cu seed layer. The Cu CMP chamber 870 and the Cu CMP chamber 890 can have a structure similar to the fluid-confining apparatus 720, and is applied for performing a chemical mechanical polishing process on the semiconductor substrate 110. The Cu ECP chamber 860, the Cu ECP chamber 802, the Cu CMP chamber 870 and the Cu CMP chamber 890 all can be applied for performing a pre-cleaning process, a post process, or a drying process. The cap layer forming chamber 880 can be applied for depositing a cap layer on the surface of the semiconductor substrate 110 so as to protect the semiconductor substrate 110. As a result, there is no oxide formed on the Cu layer of the semiconductor substrate 110 after the semiconductor substrate 110 leave the process equipment 850, and the material layers or devices located below the Cu layer are protected from external pollutants.

In this embodiment, the robot arm 872 can be a robot arm having single blade, or a robot arm having multiple blades. After the semiconductor substrate 110 is loaded into the process equipment 850, the semiconductor substrate 110 can be transferred among the load port 816, the single wafer load lock chamber 830, the buffer chambers 832, 842 and the chambers 802, 812, 822, 840, 852, 860, 870, 880, 890 through the robot arms 872.

It should be understood by a person skilled in this art that the chambers 802, 812, 822, 840, 852, 860, 870, 880, 890 in this embodiment are actually can be replaced by other process chambers, such as a post-deposition chamber, sputtering process chamber, any chemical vapor deposition chamber or any physical vapor deposition chamber, according to the product throughput and the product quality. A copper process is taken as an example to illustrate the present invention applied to an all-in-one system in a back-end-of-the-line process (BEOL process). However, it should also be understood by a person skilled in this art that the present invention should not be limited to the copper process. The present invention can be applied for forming any needed material layer or semiconductor device.

Figure 32:
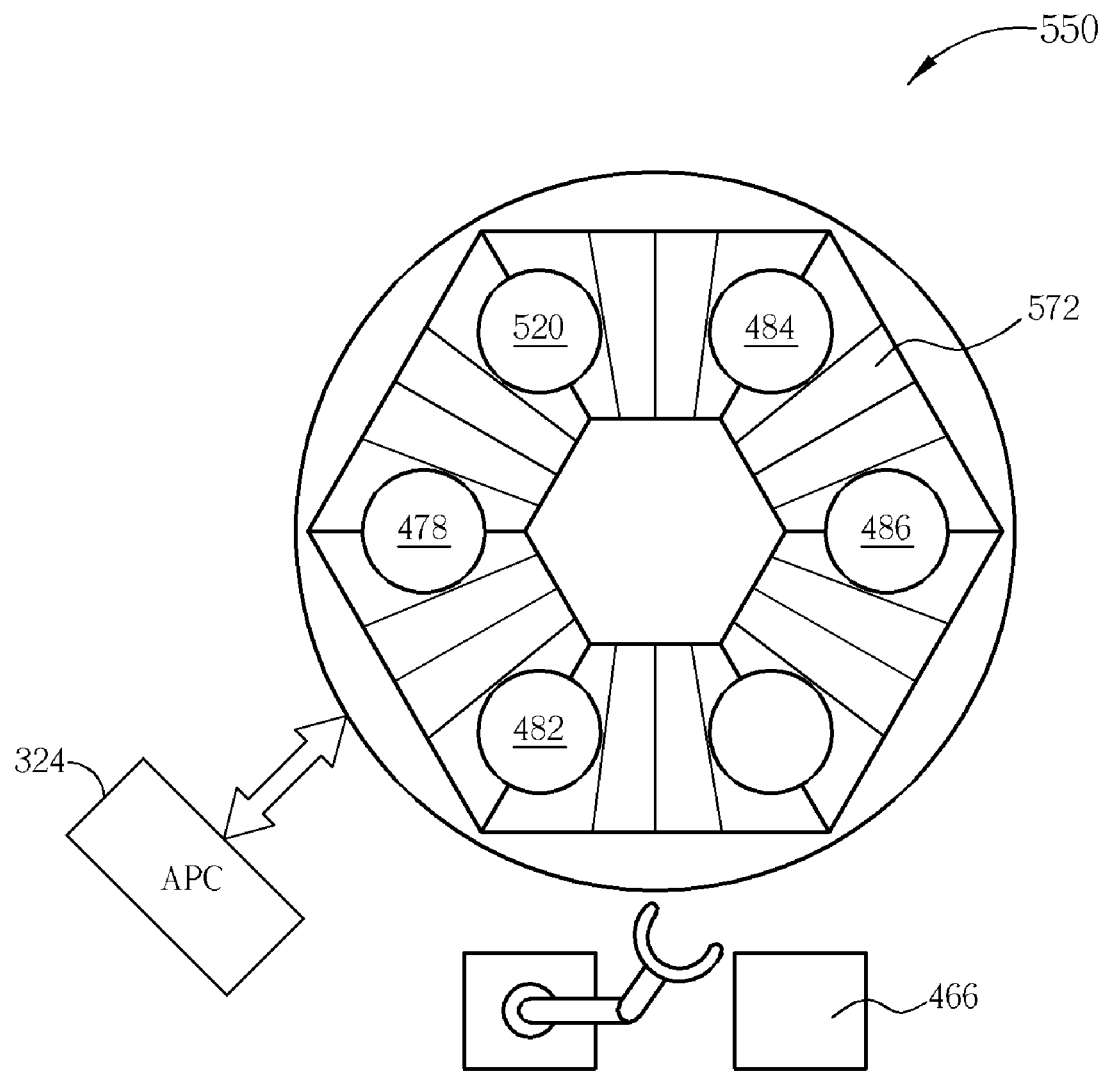
FIG. 32 is a schematic diagram illustrating a process equipment according to a seventh preferred embodiment of the present invention.

Furthermore, a conveying belt can be utilized in the present invention as a transferring tool for transferring the semiconductor substrate 110 inside the process equipment. Please refer to FIG. 32, which is a schematic diagram illustrating a process equipment 550 according to a seventh preferred embodiment of the present invention, where like number numerals designate similar or the same parts, regions or elements. As shown in FIG. 32, the process equipment 550 includes an APC system 324, a loading device 466, at least a fluid-confining apparatus 520, at least a transferring device 572, at least a seed layer deposition chamber 478, at least a barrier layer deposition chamber 482, at least a drying chamber 484 and at least a pre-deposition chamber 486. The fluid-confining apparatus 520 can have a structure similar to the fluid-confining apparatus 220, the fluid-confining apparatus 320, or the fluid-confining apparatus 720, and is applied to any possible semiconductor process, such as an electro chemical plating process, a cleaning process, or a chemical mechanical polishing process.

The main difference between this embodiment and the fifth embodiment is that the transferring device includes a conveying belt 572 in this embodiment. The semiconductor substrate 110 can be among the fluid-confining apparatus 420, the seed layer deposition chamber 478, the barrier layer deposition chamber 482, the drying chamber 484 and the pre-deposition chamber 486 through the conveying belt 572 after the semiconductor substrate 110 is loaded in the process operation 466 of the process equipment 550. Since the semiconductor substrate 110 need not be fixed by both the cathode electrode and the fixing component in advance, the semiconductor substrate 110 can be easily transferred into different chambers through a simple conveying belt 572 and directly undergoes various processes in the process equipment 550.

The traditional ECP process, the traditional cleaning process, or the traditional CMP process is usually an opening system. In these opening systems, the process fluid or chemical substances contained in the process fluid evaporates easily into the surroundings. The moisture around the operation device or the chamber is therefore increased, and pollutant substances might exist around the operation device or the chamber. Thus, these traditional devices or traditional chambers cannot be integrated with other devices or chamber. Since the consumed quantity of the process fluid in the present invention is decreased, and the process fluid is immediately recovered through the fluid-confining apparatus, there is less moisture inside and around the fluid-confining apparatus. Accordingly, the fluid-confining apparatus of the present invention can be integrated with other devices or chamber in a process equipment. On one hand, time for transferring the semiconductor substrate among chambers can be saved. On the other hand, the material layer of the semiconductor substrate is protected from being oxidized, so the process time and process cost for removing oxide is saved.

Figure 33:
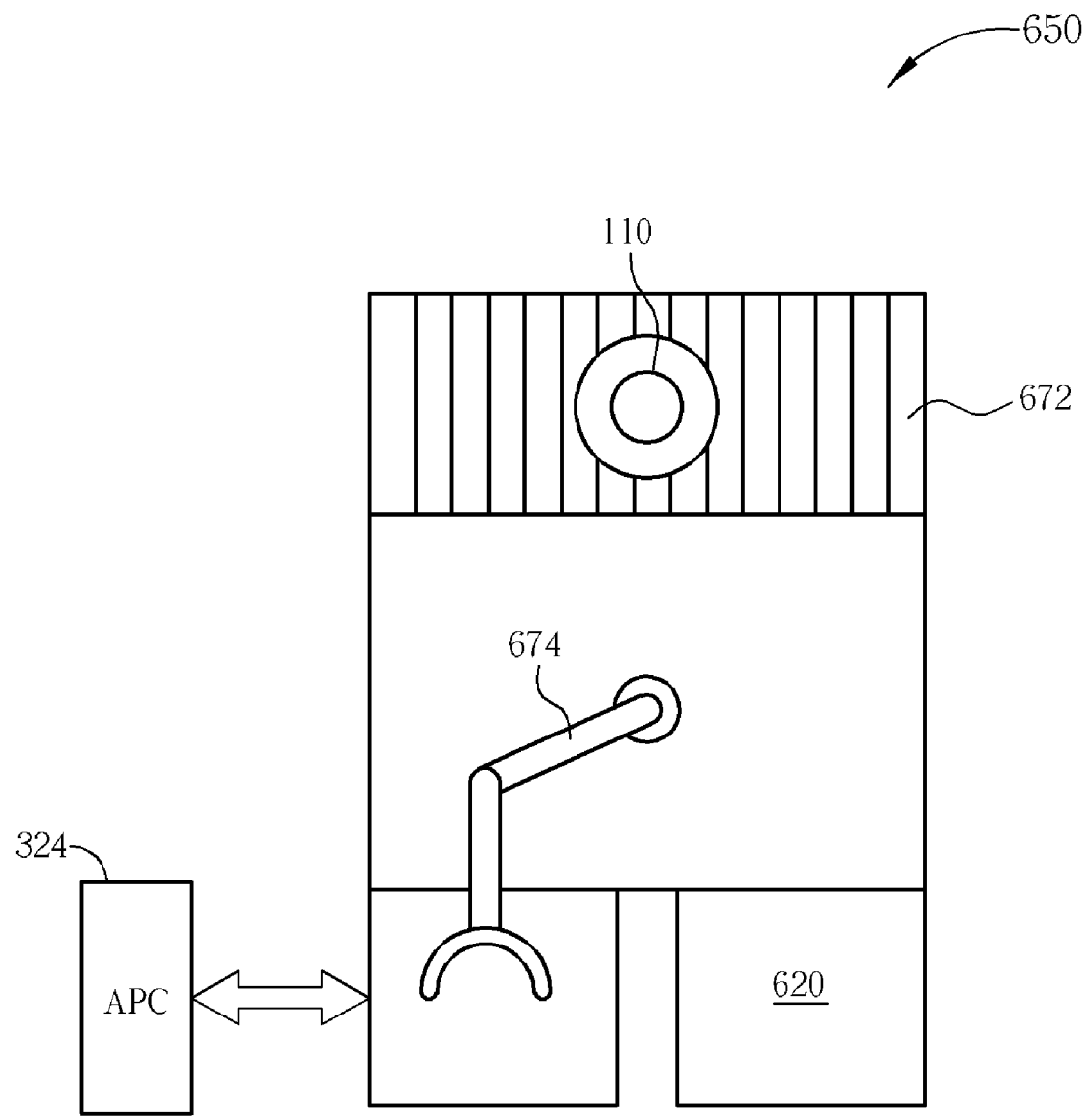
FIG. 33 is a schematic diagram illustrating a process equipment according to an eighth preferred embodiment of the present invention.

In addition, a conveying belt and a robot arm can be simultaneously used as the transferring device of the process equipment in the present invention. Please refer to FIG. 33, which is a schematic diagram illustrating a process equipment 650 according to an eighth preferred embodiment of the present invention, where like number numerals designate similar or the same parts, regions or elements. As shown in FIG. 33, the process equipment 650 includes an APC system 324, at least a fluid-confining apparatus 620, a conveying belt 672 and a robot arm 674. The fluid-confining apparatus 620 can have a structure similar to the fluid-confining apparatus 220, the fluid-confining apparatus 320, or the fluid-confining apparatus 720, and is applied to any possible semiconductor process, such as an electro chemical plating process, a cleaning process, or a chemical mechanical polishing process. The robot arm 674 is applied for transferring the semiconductor substrate 110 between the conveying belt 672 and the fluid-confining apparatus, and the conveying belt 672 is applied for transferring the semiconductor substrate 110 in or out of the process equipment 650.

The semiconductor substrate 110, which is waiting to be treated, is first transferred to a position around the fluid-confining apparatus 620 through the conveying belt 672. Subsequently, the above-mentioned semiconductor substrate 110 is clamped by the robot arm 674, and is transferred onto the substrate holder 130 of the fluid-confining apparatus 620. Thereafter, a process, such as an electro chemical plating process or a cleaning process, can be performed on the semiconductor substrate 110 by the fluid-confining apparatus 620. After the said process, the semiconductor substrate 110 is transferred onto the conveying belt 672 through the robot arm 674, and is then transferred toward the following process equipments. Accordingly, the process equipment 650 can keep on handling the next semiconductor substrate 110.

Since the semiconductor substrate need not be disposed between the cathode electrode and the fixing component in advance, and need not be inclined when the semiconductor substrate is going into the electrolyte fluid, a great deal of semiconductor substrates 110 can be handled in batch by the process equipment. Thus, the output of the process is significantly improved. Furthermore, the semiconductor substrate can be easily transferred into different chambers through a disk type structure or through a belt type structure on the substrate holder, and directly undergoes the processes in a predetermined position. As a result, a loading device can even be omitted, and it is easier to wet the semiconductor substrate.

Those skilled in the art will readily observe that numerous modifications and alterations of the device and method may be made while retaining the teachings of the invention.

What is claimed is:

1. A fluid-confining apparatus applied for plating, comprising:
    at least a substrate holder, adapted for holding at least a semiconductor substrate;
    at least a cathode electrode, disposed on the substrate holder, adapted for electrically connecting to the semiconductor substrate;
    at least an anode system, positioned above the substrate holder, substantially corresponding to the semiconductor substrate, the anode system and the substrate holder being a reaction height apart, at least a treatment region and at least a non-treatment region being defined between the anode system and the cathode electrode;
    at least a confining fluid supplying tube, disposed corresponding to the non-treatment region, adapted for supplying at least a confining fluid;
    at least a confining fluid recovering tube, disposed corresponding to the non-treatment region, adapted for recovering the confining fluid;
    at least a process fluid supplying tube, disposed corresponding to the treatment region, adapted for supplying at least an electrolyte fluid; and
    at least a process fluid recovering tube, disposed corresponding to the treatment region, adapted for recovering the electrolyte fluid;
    wherein the confining fluid supplying tube and the process fluid supplying tube are adapted to supply the confining fluid and the electrolyte fluid, respectively, at the same time during a plating process, and wherein the confining fluid does not dissolve in the electrolyte fluid.

2. The fluid-confining apparatus of claim 1, wherein the confining fluid is in liquid state, gas state, vapor state, or gel state.

3. The fluid-confining apparatus of claim 1, wherein the semiconductor substrate is a wafer, the treatment region corresponds to a front side of the wafer, and the non-treatment region corresponds to an edge bevel of the wafer.

* * * * *